US011664822B2

(12) United States Patent
Kumano et al.

(10) Patent No.: US 11,664,822 B2
(45) Date of Patent: May 30, 2023

(54) MULTIDIMENSIONAL ENCODING AND DECODING IN MEMORY SYSTEM

(71) Applicant: KIOXIA CORPORATION, Tokyo (JP)

(72) Inventors: Yuta Kumano, Kawasaki Kanagawa (JP); Hironori Uchikawa, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/680,164

(22) Filed: Feb. 24, 2022

(65) Prior Publication Data

US 2023/0083269 A1 Mar. 16, 2023

(30) Foreign Application Priority Data

Sep. 10, 2021 (JP) .............................. JP2021-147959

(51) Int. Cl.
| | |
|---|---|
| *H03M 13/00* | (2006.01) |
| *H03M 13/11* | (2006.01) |
| *H03M 13/15* | (2006.01) |
| *G06F 11/10* | (2006.01) |
| *H03M 13/37* | (2006.01) |
| *H03M 13/45* | (2006.01) |

(52) U.S. Cl.
CPC ..... *H03M 13/1111* (2013.01); *G06F 11/1068* (2013.01); *H03M 13/1575* (2013.01); *H03M 13/3723* (2013.01); *H03M 13/45* (2013.01)

(58) Field of Classification Search
CPC .......... H03M 13/1111; H03M 13/1575; H03M 13/3723; H03M 13/45; G06F 11/1068
See application file for complete search history.

(56) References Cited

U.S. PATENT DOCUMENTS

| | | | |
|---|---|---|---|
| 8,839,070 B2 | 9/2014 | Koganei | |
| 9,337,873 B2 | 5/2016 | Marrow et al. | |
| 9,397,706 B1 * | 7/2016 | Steiner | H03M 13/45 |

(Continued)

FOREIGN PATENT DOCUMENTS

| | | |
|---|---|---|
| JP | 2008-017001 A | 1/2008 |
| JP | 2022-124682 A | 8/2022 |

*Primary Examiner* — Esaw T Abraham
(74) *Attorney, Agent, or Firm* — Kim & Stewart LLP

(57) ABSTRACT

A memory system includes an encoder and a decoder. The encoder is configured to generate multi-dimensionally-coded data to be written into the non-volatile memory. Data bits of the multi-dimensionally-coded data are grouped into first and second dimensional codes with respect to first and second dimensions, respectively. The decoder is configured to, with respect to each of the first and second dimensional codes included in read multi-dimensionally-coded data, generate a syndrome value of the dimensional code, generate low-reliability location information, generate a soft-input value based on the syndrome value and the low-reliability location information, decode the dimensional code through correction of the dimensional code using the soft-input value, and store modification information indicating a bit of the dimensional code corrected through the correction and reliability information indicating reliability of the correction. The decoder generates the soft-input value also based on the modification information and the reliability information in the memory.

20 Claims, 11 Drawing Sheets

(56) References Cited

U.S. PATENT DOCUMENTS

| | | | |
|---|---|---|---|
| 9,792,176 B2* | 10/2017 | Blaichman | G06F 3/0619 |
| 10,284,233 B2* | 5/2019 | Bazarsky | G06F 11/1012 |
| 10,547,327 B2* | 1/2020 | Palangappa | H03M 13/1108 |
| 10,621,035 B2* | 4/2020 | Motwani | G06F 11/1048 |
| 10,892,776 B1* | 1/2021 | Kuo | G06F 11/1068 |
| 11,218,165 B2* | 1/2022 | Chen | G11C 29/52 |
| 2019/0087107 A1 | 3/2019 | Watanabe | |
| 2022/0261312 A1 | 8/2022 | Kubota et al. | |

* cited by examiner

MULTIDIMENSIONAL ENCODING AND DECODING IN MEMORY SYSTEM

CROSS-REFERENCE TO RELATED APPLICATION

This application is based upon and claims the benefit of priority from Japanese Patent Application No. 2021-147959, filed Sep. 10, 2021, the entire contents of which are incorporated herein by reference.

FIELD

Embodiments described herein relate generally to a memory system.

BACKGROUND

In a memory system, error-correction coded data is stored together with write data in order to reliably read the write data. Therefore, when reading the data stored in the memory system, the error-correction coded data is decoded.

DETAILED DESCRIPTION

Embodiments provide a memory system capable of reducing the amount of memory and time required for decoding.

In general, according to an embodiment, a memory system includes a non-volatile memory and a memory controller configured to write data into and read data from the non-volatile memory. The memory controller includes an encoder and a decoder. The encoder is configured to generate multi-dimensionally-coded data containing write data bits and parity bits, to be written into the non-volatile memory. Data bits of the multi-dimensionally-coded data are grouped into a plurality of first dimensional codes with respect to a first dimension and a plurality of second dimensional codes with respect to a second dimension. The decoder is configured to receive the multi-dimensionally-coded data read from the non-volatile memory. The decoder is configured to, with respect to each of the first and second dimensional codes included in the read multi-dimensionally-coded data, generate a syndrome value of the dimensional code, generate low-reliability location information indicating one or more low reliable bits in the dimensional code, generate a soft-input value based on the syndrome value and the low-reliability location information, decode the dimensional code through correction of the dimensional code using the soft-input value, and store, in memory, modification information indicating one or more bits of the dimensional code corrected through the correction and reliability information indicating reliability of the correction. The decoder generates the soft-input value also based on the modification information and the reliability information stored in the memory.

A memory system according to embodiments will be described in detail with reference to the accompanying drawings. The present disclosure is not limited to the following embodiments.

In recent years, memory systems using non-volatile memory such as NAND flash memory (hereinafter, simply referred to as NAND memory) are used in various purposes due to the high speed thereof. However, the data read from the non-volatile memory may contain an error due to passage of time after being stored in the non-volatile memory, noise generated during reading/writing, and the like. Therefore, in general, encoding processing using an error-correction code is executed on data to be stored in the non-volatile memory, and decoding processing using the error-correction code is executed at the time of reading to remove the error contained in the read data.

Figure 1:
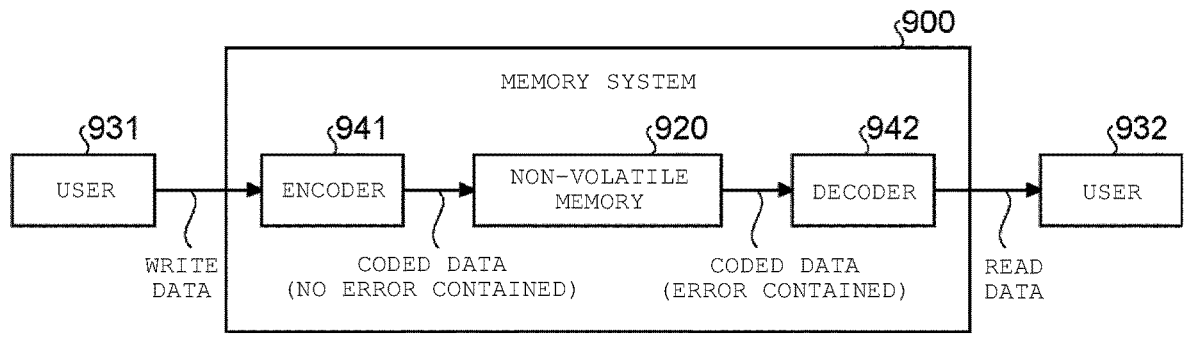
FIG. 1 is a diagram illustrating an operation of encoding and decoding data with an error-correction code.

FIG. 1 is a diagram illustrating an operation of encoding and decoding data in a memory system according to a comparative example with an error-correction code. A user 931 and a user 932 may be information processing devices such as a personal computer, a server device, a portable information device, and a digital still camera, respectively.

The user 931 transmits data to be written (hereinafter, referred to as write data) to a memory system 900. The memory system 900 encodes the write data received from the user 931 by using an encoder 941 and writes the coded data (codeword) generated thereby to the non-volatile memory 920. Therefore, the coded data written in a non-volatile memory 920 basically does not contain an error.

The coded data stored in the non-volatile memory 920 is read, for example, in response to a read request from the user 932. Here, the read coded data may contain an error. The original data is restored by executing the decoding while removing the error contained in the read coded data by using a decoder 942. Thereafter, the original data, which is the restored uncoded write data, is transmitted to the user 932. The user 932 that issued the read request may be the same user as the user 931 that issued the write request, or may be another user.

Here, it is assumed that the encoder 941 encodes the write data into a codeword composed of binary information (bits) expressed by '0' or '1', and that the codeword is stored in the non-volatile memory 920 as binary information. Hereinafter, when reading data from the non-volatile memory 920, the stored data is read as binary information indicating whether it is '0' or '1' and input to the decoder 942, the input information is referred to as a hard-input value. On the other hand, when the stored data is read out as information on the probability of being '0' or the probability of being '1' and input to the decoder 942, the probability information is referred to as a soft-input value.

Further, when the decoding result output by the decoder 942 is binary information as to whether the original write data is '0' or '1', the output information is referred to as a hard-output value. On the other hand, when the decoding result output by the decoder 942 includes the probability information of whether the original write data is '0' or '1', the output information is referred to as a soft-output value.

A soft-input soft-output (SISO) decoder that receives such a soft-input value and outputs a soft-output value is used, for example, as a component code decoder for a multidimensional error-correction code.

Here, the multidimensional error-correction code refers to a symbol in which at least one or more constituent units of an error-correction code are multiply protected by a plurality of smaller component codes. Further, one symbol is composed of, for example, 1 bit (element of binary field) or an alphabetic element such as a finite field other than a binary field. In order to facilitate the description, an error-correction code of a binary field in which one symbol is composed of 1 bit will be described below as an example. There may be cases in the description where symbols and bits are mixed, but both have the same meaning.

Figure 2:
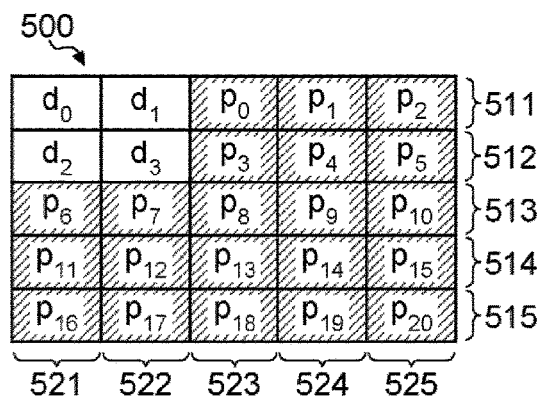
FIG. 2 is a diagram showing an example of a product code.

As an example of a multidimensional error-correction code, a product code is shown in FIG. 2. In a product code 500 shown in FIG. 2, each information symbol $d_0$ to $d_3$, which is a constituent unit, has a structure protected by Hamming codes 511 to 515 and 521 to 525 having an information length of 2 symbols and a parity length of 2 symbols, respectively, in a row direction (horizontal direction in FIG. 2) and a column direction (vertical direction in FIG. 2). In such a product code 500, all the information symbols $d_0$ to $d_3$ and parity symbols $p_0$ to $p_{20}$ are doubly protected by the Hamming code in the row direction and the Hamming code in the column direction. In the product code shown in FIG. 2, all symbols are doubly protected by component codes in the row direction (referred to as dimension 1) and the column direction (referred to as dimension 2). The multidimensional error-correction code is not limited thereto, and may be, for example, a generalized low density parity check code (LDPC). In general multidimensional error-correction codes including generalized LDPC codes, the multiplicity of protection may be different for each symbol, and the component codes cannot be grouped as in dimension 1 and dimension 2, but the present technology can be applied to such a code configuration.

In the following, for the sake of simplicity, an example of using a two-dimensional error-correction code in which each symbol is protected by two component codes that can be grouped into dimension 1 and dimension 2 will be described. Each component code in each dimension contains one or more component codes defined for each dimension. In the following, a component code corresponding to each dimension containing one or more component codes may be referred to as a component code group. For example, a dimension 1 component code group and a dimension 2 component code group include n1 component codes and n2 component codes, respectively. The applicable error-correction code is not limited thereto, and may be an N-dimensional error-correction code in which at least one of the symbols constituting the code is protected by N component code groups (N is an integer of 2 or more). When expressed by the number of component codes contained in each component code group, the N-dimensional error-correction code is protected by M component codes (M is the sum of ni ($1 \leq i \leq N$), N is an integer of 2 or more, and ni is the number of component codes in an i-th dimension).

Figure 3:
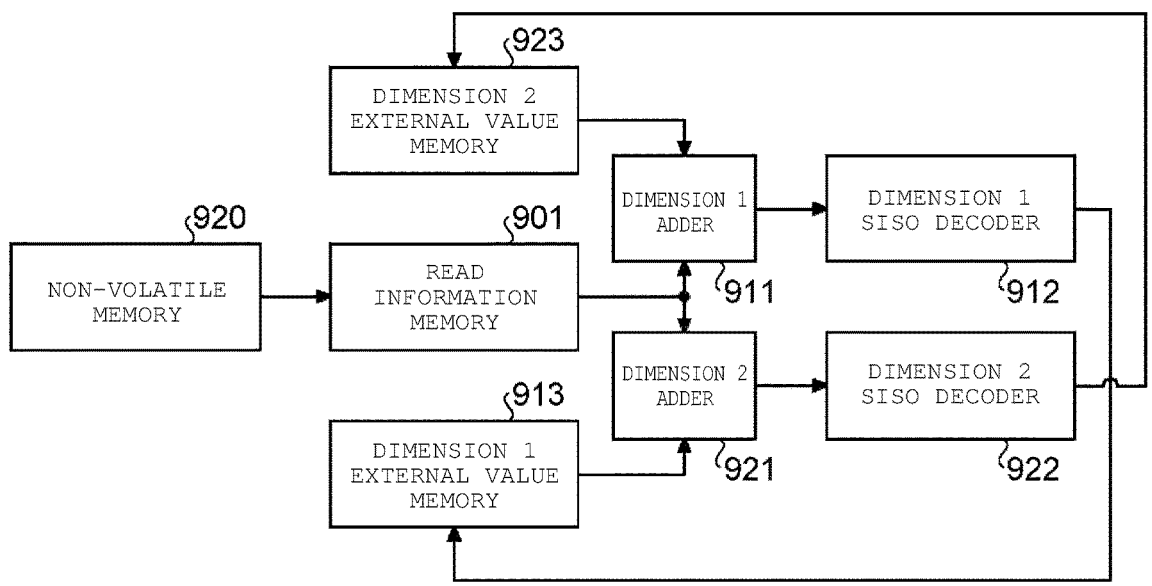
FIG. 3 is a block diagram showing an example of functional blocks that execute turbo decoding on a two-dimensional error-correction code.

Turbo decoding can be performed on such a multidimensional error-correction code. FIG. 3 is a diagram showing an example of functional blocks that execute turbo decoding on a two-dimensional error-correction code. Further, FIG. 4 is a flowchart showing an example of the processing flow by the functional block shown in FIG. 3.

As shown in FIG. 3, the functional blocks that perform turbo decoding on the two-dimensional error-correction code include a read information memory 901, a dimension 1 adder 911, a dimension 1 SISO decoder 912, a dimension 1 external value memory 913, a dimension 2 adder 921, a dimension 2 SISO decoder 922, and a dimension 2 external value memory 923.

Figure 4:
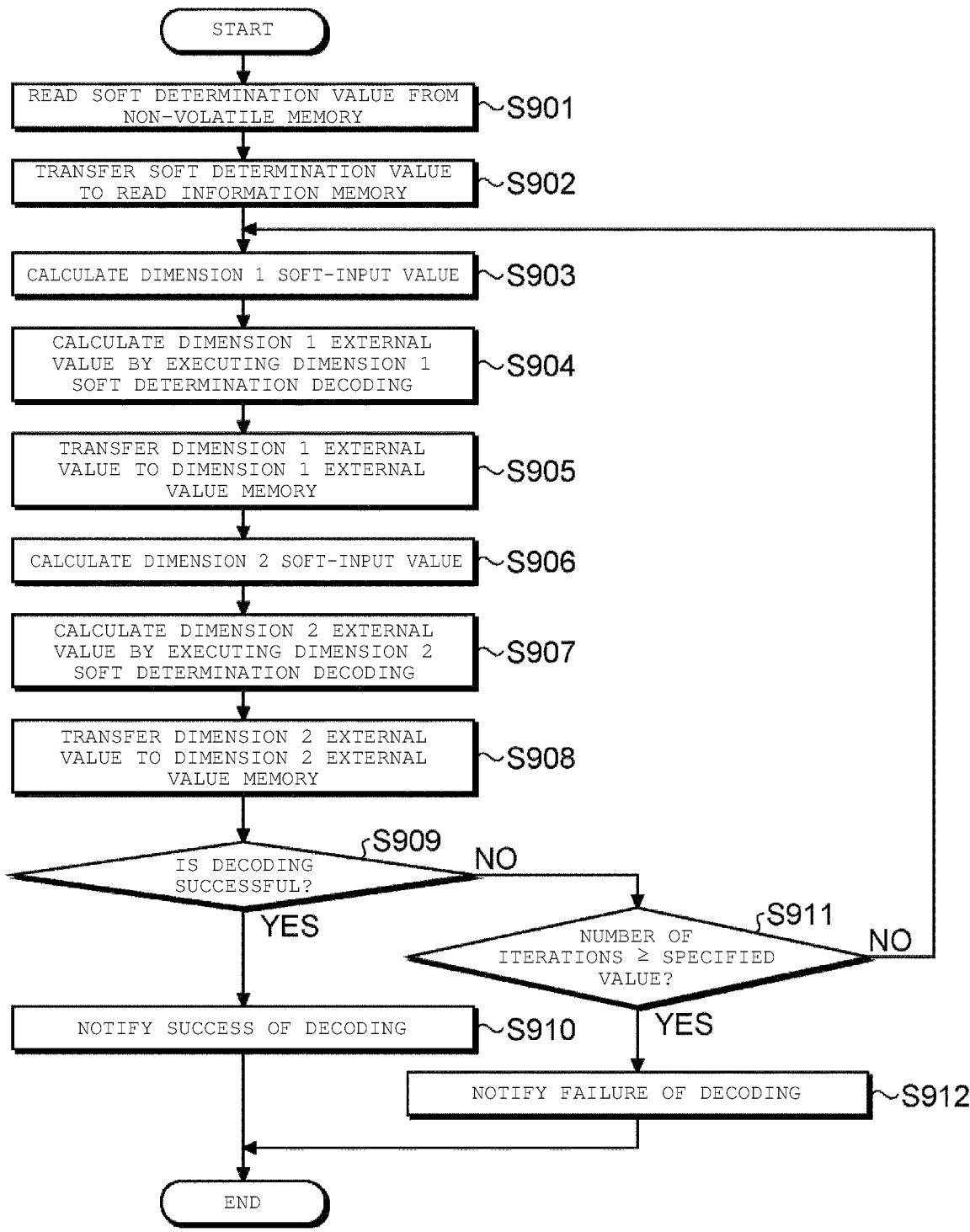
FIG. 4 is a flowchart of a processing flow according to the functional block shown in FIG. 3.

In the turbo decoding operation by such functional blocks, as shown in FIG. 4, first, the error-correction code is read from the non-volatile memory 920 as a soft determination value (step S901). The soft determination value is transferred to the read information memory 901 as read information and stored (step S902).

Next, the read information in the read information memory 901 and a dimension 2 external value in the dimension 2 external value memory 923 are added by the dimension 1 adder 911, whereby a dimension 1 soft-input value (=read information+dimension 2 external value) is calculated (step S903). It is assumed that both the dimension 1 external value memory 913 and the dimension 2 external value memory 923 are reset (zero cleared) at the start of the present operation.

Subsequently, the dimension 1 soft-input value calculated by the dimension 1 adder 911 is input to the dimension 1 SISO decoder 912 for each component code. The dimension 1 SISO decoder 912 calculates the dimension 1 external value by executing the dimension 1 soft determination decoding on the input dimension 1 soft-input value (step S904). The calculated dimension 1 external value is transferred to the dimension 1 external value memory 913 and stored (step S905).

Next, the read information in the read information memory 901 and the dimension 1 external value in the dimension 1 external value memory 913 are added by the dimension 2 adder 921, whereby a dimension 2 soft-input value (=read information+dimension 1 external value) is calculated (step S906).

Subsequently, the dimension 2 soft-input value calculated by the dimension 2 adder 921 is input to the dimension 2 SISO decoder 922 for each component code. The dimension 2 SISO decoder 922 calculates the dimension 2 external value by executing the dimension 2 soft determination decoding on the input dimension 2 soft-input value (step S907). The calculated dimension 2 external value is transferred to the dimension 2 external value memory 923 and stored (step S908).

Next, it is determined whether or not the decoding is successful (step S909). Successful decoding may mean, for example, that decoded data that can be determined to be correct is found. When the decoding is successful (YES in step S909), the external control unit or the like is notified of the decoded data found with the success of the decoding (step S910), and the present operation ends. On the other hand, when the decoding is not successful (NO in step S909), it is determined whether or not the number of iterations of the present operation reaches a preset specified value (step S911), and when the specified value is not reached (NO in step S911), the processing returns to step S903 and the subsequent operations are executed. Further, when the specified value is reached (YES in step S911), the failure of decoding is notified to the external control unit or the like (step S912), and the present operation ends. The number of iterations may be, for example, the number of times the operations of steps S903 to S908 of FIG. 4 are repeated.

A Maximum A Posteriori (Max-log-MAP) decoder that employs a decoding algorithm that involves calculation of an external value can be used for the dimension 1 SISO decoder 912 and the dimension 2 SISO decoder 922 in the configuration shown in FIG. 3. The Max-log-MAP decoder is a decoder that calculates a posterior probability value for each bit from MAP decoded word and its opposite decoded word of each bit. For the sake of simplification of the description, a quantity proportional to a posterior probability and an approximate value thereof will also be referred to as posterior probabilities hereafter. For example, assuming that the prior probabilities of all codewords are equal, the likelihood of the decoded word is a quantity proportional to the posterior probability value of the decoded word.

Here, a MAP decoded word $c^*$ refers to a codeword $c^* = \mathrm{argmax}_c P(c|S)$ having a highest posterior probability P calculated from a soft-input value S among all the codewords $c \in C$. Further, the opposite decoded word of the i-th bit is calculated from the soft-input value S among the codewords having a value different from the MAP decoded word $c^*$ in the i-th bit among all the codewords $c \in C$ refers to a codeword $c_{p,i} = \mathrm{argmax}_c P(c|S, c_i \neq c^*_i)$ having the highest posterior probability P. Therefore, in the intermediate hard determination value calculated in the middle of decoding by the Max-log-MAP decoder, the MAP decoded word $c^*$ and all opposite codewords $c_{p,i}$ is included.

In addition, instead of the set C of all codewords, a set $C' \subset C$ of codewords having a relatively high posterior probability may be used. In that case, an approximate MAP decoded word and an approximate opposite decoded word of the i-th bit are obtained. Max-log-MAP decoding using such a codeword subset C' may be inferior in correction ability to Max-log-MAP decoding using all codeword sets C. However, the amount of calculation is reduced, therefore decoding can be performed at a higher speed. For the sake of simplification of the description, the term MAP decoded word will be used hereafter, including a case where an approximate MAP decoded word is used.

In Max-log-MAP decoding using the codeword subset C', a logarithmic posterior probability ratio R of the i-th bit is approximately calculated from the posterior probability ratios of the MAP decoded word $c^*$ and the opposite decoded words $c_{p,i}$ using the following Equation (1).

$$R = (1 - 2c_i) \ln\left(\frac{P(c^* | S)}{P(c_{p,i} | S)}\right) \quad (1)$$

The external value of each dimension can be obtained by subtracting the soft-input value $S_i$ of each dimension from the logarithmic posterior probability ratio R obtained by Equation (1). In the present description, Max-log-MAP decoding is given as an example of a decoding algorithm that calculates an external value from an intermediate hard determination value calculated in the middle of decoding, but various decoding algorithms may be used other than that.

Since a turbo decoder using the SISO decoder as described above must store the external value, which is the probability information, in the external value memory, the amount of memory required for decoding may increase. Further, an increase in the amount of memory required for decoding means an increase in the amount of memory accessed during the decoding processing, which causes a decrease in the decoding speed and an increase in power consumption. Therefore, it is desirable to provide a memory system capable of reducing the amount of memory required for decoding.

Figure 5:
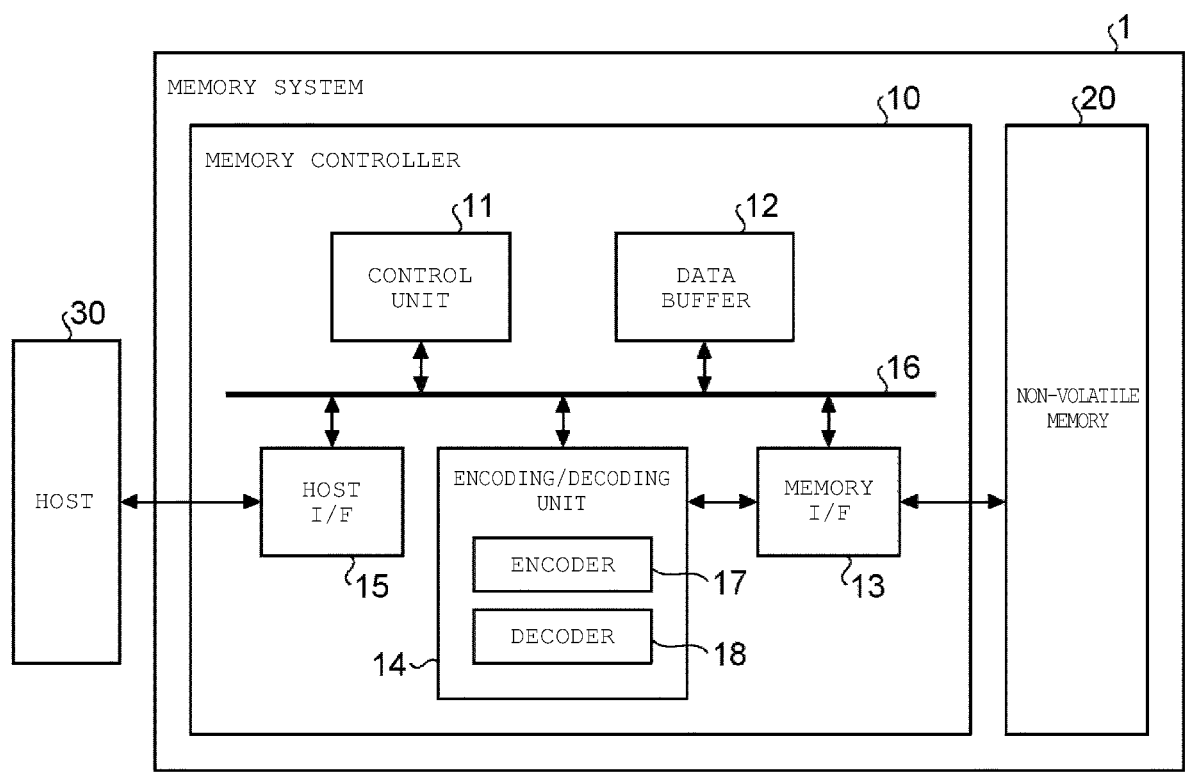
FIG. 5 is a block diagram of a memory system according to an embodiment.

FIG. 5 is a block diagram showing a schematic configuration example of the memory system according to the embodiment. As shown in FIG. 5, a memory system 1 includes a memory controller 10 and a non-volatile memory 20. The memory system 1 can be connected to a host 30, and FIG. 5 shows a state in which the memory system 1 is connected to the host 30. The host 30 may be, for example, an electronic device such as a personal computer or a mobile terminal.

The non-volatile memory 20 is a non-volatile memory that stores data in a non-volatile way, and is, for example, a NAND memory. In the following description, a case where a NAND memory is used as the non-volatile memory 20 is illustrated. However, as the non-volatile memory 20, it is also possible to use a storage device other than the NAND memory such as a three-dimensional structure flash memory, resistance random access memory (ReRAM), and ferroelectric random access memory (FeRAM). Further, the non-volatile memory 20 is not necessarily a semiconductor memory, and the present embodiment can be applied to various storage media other than the semiconductor memory.

The memory system 1 may be a memory card or the like in which the memory controller 10 and the non-volatile memory 20 are configured as one package, or may be a solid state drive (SSD) or the like.

The memory controller 10 controls writing to the non-volatile memory 20 according to a write request from the host 30. Further, the memory controller 10 controls reading from the non-volatile memory 20 according to a read request from the host 30. The memory controller 10 includes a host I/F (host interface) 15, a memory I/F (memory interface) 13, a control unit 11, an encoding/decoding unit (codec) 14, and a data buffer 12. The host I/F 15, the memory I/F 13, the control unit 11, the encoding/decoding unit 14, and the data buffer 12 are connected to each other by an internal bus 16.

The host I/F 15 performs processing according to an interface standard with the host 30, and outputs a command received from the host 30, user data to be written, and the like to the internal bus 16. Further, the host I/F 15 transmits the user data that is read from the non-volatile memory 20 and restored, a response from the control unit 11, and the like to the host 30.

The memory I/F 13 performs a write operation to the non-volatile memory 20 based on an instruction of the control unit 11. Further, the memory I/F 13 performs a read operation from the non-volatile memory 20 based on an instruction of the control unit 11.

The control unit 11 controls each component of the memory system 1. When the control unit 11 receives a command from the host 30 via the host I/F 15, the control unit 11 performs control according to the command. For example, the control unit 11 instructs the memory I/F 13 to write the user data to the non-volatile memory 20 according to the command from the host 30. Further, the control unit 11 instructs the memory I/F 13 to read the user data from the non-volatile memory 20 according to the command from the host 30.

When the control unit 11 receives a write request from the host 30, the control unit 11 stores user data in the data buffer 12 and determines a storage region (memory area) of the non-volatile memory 20 where the user data is stored. That is, the control unit 11 manages a write destination of the user data. Correspondence between a logical address of the user data received from the host 30 and a physical address indicating a storage region of the non-volatile memory 20 in which the user data is stored is stored as an address conversion table.

When the control unit 11 receives a read request from the host 30, the control unit 11 converts a logical address specified by the read request into a physical address by using the above-mentioned address conversion table, and instructs the memory I/F 13 to read from the physical address.

In the NAND memory, writing and reading are generally performed in data units called pages, and erasing is performed in data units called blocks. In the present embodiment, a plurality of memory cells connected to a same word line are referred to as memory cell groups. When the memory cell is a single level cell (SLC), one memory cell group corresponds to one page. When the memory cell is a multi-level cell (MLC), one memory cell group corresponds to a plurality of pages. In addition, each memory cell is connected to a word line and also to a bit line. Therefore, each memory cell can be identified by an address that identifies a word line and an address that identifies a bit line.

The data buffer 12 temporarily stores the user data received from the host 30 in the memory controller 10 until the user data is stored in the non-volatile memory 20. Further, the data buffer 12 temporarily stores the user data read from the non-volatile memory 20 until the user data is transmitted to the host 30. For the data buffer 12, for example, a general-purpose memory such as static random access memory (SRAM) or dynamic random access memory (DRAM) may be used.

The user data transmitted from the host 30 is transferred to the internal bus 16 and temporarily stored in the data buffer 12. The encoding/decoding unit 14 encodes the user data to generate a codeword. Further, the encoding/decoding unit 14 decodes the received read data from the non-volatile memory 20 and restores the user data. To achieve this objective, the encoding/decoding unit 14 includes an encoder 17 and a decoder 18. The data encoded/decoded by the encoding/decoding unit 14 may include control data or the like used in the memory controller 10 in addition to the user data.

Next, the write operation of the present embodiment will be described. The control unit 11 instructs the encoder 17 to encode the user data when writing the user data to the non-volatile memory 20. At that time, the control unit 11 determines a storage location (storage address) of the codeword in the non-volatile memory 20, and also instructs the memory I/F 13 of the determined storage location.

The encoder 17 encodes the user data in the data buffer 12 to generate a codeword based on the instruction from the control unit 11. As the encoding method, for example, an encoding method using a Bose-Chandhuri-Hocquenghem (BCH) code or a Reed-Solomon (RS) code may be adopted. The codeword generated by the encoder 17 is a multidimensional error-correction code such as the product code 500 illustrated with reference to FIG. 2 above. As described above, in the product code 500 illustrated in FIG. 2, the information bits (may be a symbol) $d_0$ to $d_3$, which are constituent units, are protected by component codes 511 to 515 and 521 to 525, which are Hamming codes having an information length of 2 bits and a parity length of 2 bits, respectively, in the row direction (horizontal direction in FIG. 2) and the column direction (vertical direction in FIG. 2). In such the product code 500, all the information bits $d_0$ to $d_3$ and the parity bits $p_0$ to $p_{20}$ are doubly protected by the component codes (Hamming codes) 511 to 515 in the row direction and the component codes (Hamming codes) 521 to 525 in the column direction. The memory I/F 13 controls to store codewords in a storage location of the non-volatile memory 20 instructed by the control unit 11.

Next, processing at the time of reading from the non-volatile memory 20 of the present embodiment will be described. When reading from the non-volatile memory 20, the control unit 11 specifies an address of the non-volatile memory 20 and instructs the memory I/F 13 to read therefrom. Further, the control unit 11 instructs the decoder 18 to start decoding. The memory I/F 13 receives data read from the specified address of the non-volatile memory 20 according to the instruction of the control unit 11, and inputs the read data to the decoder 18.

Figure 6:
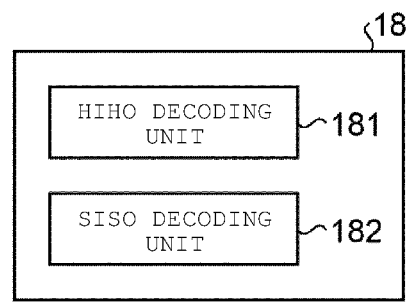
FIG. 6 is a block diagram of a decoder according to the embodiment.

The decoder 18 decodes the received data, which is read from the non-volatile memory 20. FIG. 6 is a block diagram showing a schematic configuration example of the decoder 18. The decoder 18 includes a hard-input hard-output (HIHO) decoding unit 181 that executes decoding of a hard determination value that is input and outputs a hard determination value as a result, and a soft-input soft-output (SISO) decoding unit 182 that executes decoding of a soft determination value that is input and outputs a soft determination value as a result.

In general, SISO decoding has a feature of higher error-correction capability than HIHO decoding but longer processing time. In the present embodiment, first, the HIHO decoding unit 181 is configured to HIHO decode the received data, which is read from the non-volatile memory 20 as a hard determination value and output a portion of the received data that cannot be decoded by the hard determination decoding as a soft determination value. Then, the SISO decoding unit 182 is configured to perform SISO decoding of the output portion of the received data as a soft determination value. However, the present embodiment is not limited to such a configuration, and various modifications may be made such as a configuration in which HIHO decoding is omitted and SISO decoding is executed for all received data.

Figure 7:
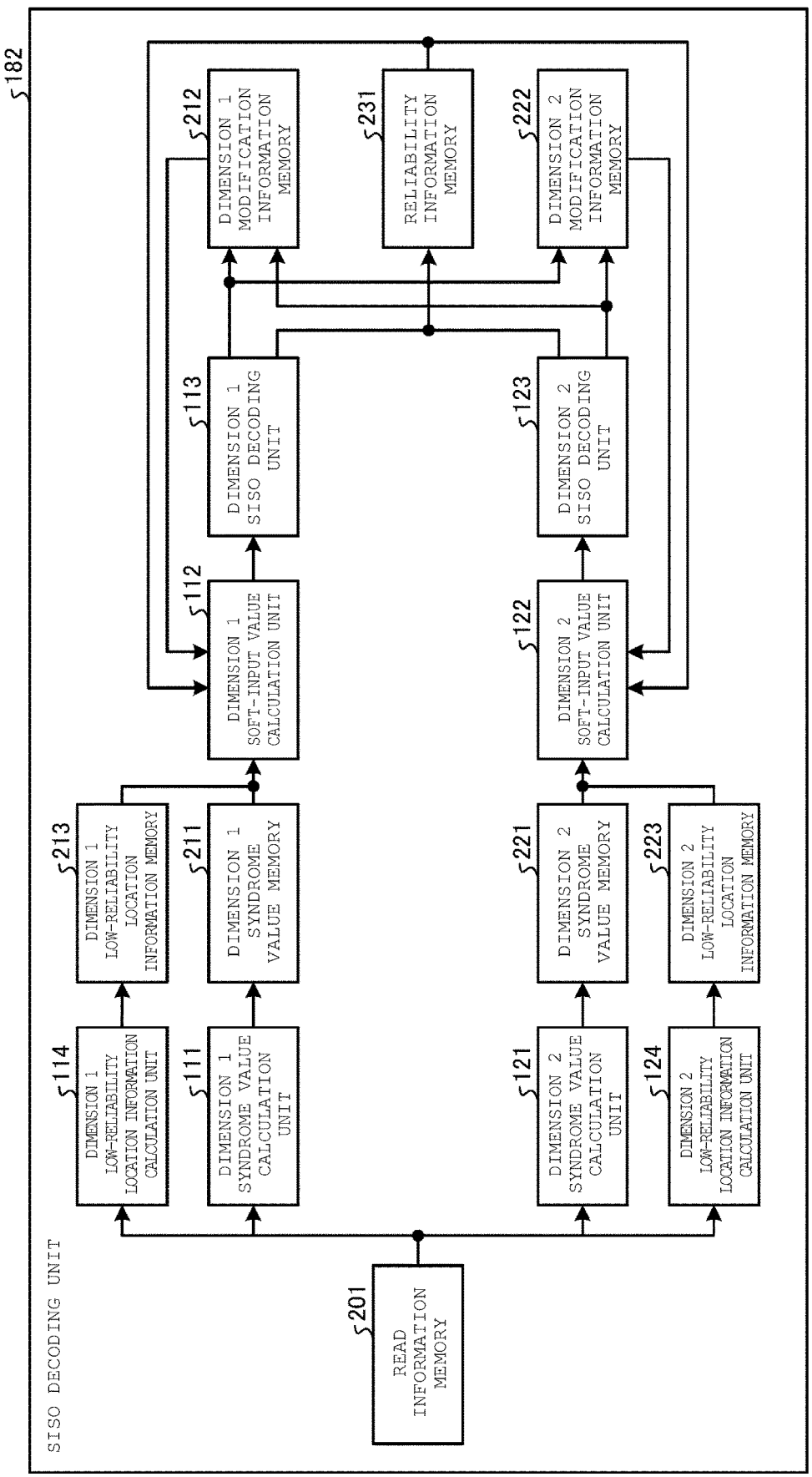
FIG. 7 is a block diagram of a SISO decoding unit in the decoder.

Next, a more detailed configuration of the SISO decoding unit 182 shown in FIG. 6 will be described in detail with reference to drawings. FIG. 7 is a block diagram showing a schematic configuration example of the SISO decoding unit 182.

In the present embodiment, a case where data stored in the non-volatile memory 20 is data coded by a two-dimensional error-correction code will be described as an example. The data stored in the non-volatile memory 20 may be data coded by a multidimensional error-correction code other than two-dimensional error-correction code.

As shown in FIG. 7, the SISO decoding unit 182 includes a read information memory 201, a dimension 1 syndrome value calculation unit 111, a dimension 1 low-reliability location information calculation unit 114, a dimension 1 low-reliability location information memory 213, a dimension 1 syndrome value memory 211, a dimension 1 soft-input value calculation unit 112, a dimension 1 SISO decoding unit 113, a dimension 1 modification information memory 212, a 1 dimension 2 syndrome value calculation unit 121, a 1 dimension 2 syndrome value memory 221, a dimension 2 low-reliability location information calculation unit 124, a dimension 2 low-reliability location information memory 223, a dimension 2 soft-input value calculation unit 122, a dimension 2 SISO decoding unit 123, a dimension 2 modification information memory 222, and a reliability information memory 231. FIG. 7 shows an example in which the symbol of code is two-dimensional. However, as described above, the SISO decoding unit 182 may have a configuration corresponding to a multidimensional error-correction code other than a two-dimensional error-correction code.

The read information memory 201 stores the read information, which is read from the non-volatile memory 20 by soft determination. In the read information, data corresponding to a hard determination value, which is binary information where each bit is 0 or 1, may be referred to as hard bit data. Further, the data corresponding to the portion of the read information excluding the hard bit data may be referred to as soft bit data. The read information memory 201 may include a hard bit memory (HMEM) for storing hard bit data and a soft bit memory (CMEM) for storing soft bit data.

The number of soft bit data (X) may be set in any applicable manner. In the following, an example of using one soft bit data SB1 (X=1) will be mainly described. The CMEM may further store not only soft bit data but also hard bit data. The value of the hard bit data stored in the HMEM can be updated during the decoding processing, but the value of the hard bit data stored in the CMEM is not updated during the decoding processing. That is, the hard bit data stored in the CMEM is read-only.

Decoding processing (for example, calculation of soft-input value) may require data called a channel value. The channel value is a value of the log-likelihood ratio (LLR) corresponding to the set of hard bit data and soft bit data. The channel value may be referred to as a channel value LLR. The channel value is determined, for example, by an LLR table in which a set of hard bit data and soft bit data and a channel value are associated with each other.

In the present embodiment where the symbol is an element in a binary field, the LLR indicates probability information about whether a bit is 0 or 1. In the following, LLR is assumed to be positive when the probability that the bit is 0 is high, and negative when the probability that the bit is 1 is high. Further, in the present embodiment, the calculated soft-input value is also expressed by LLR.

LLR can be expressed by reducing a value to binary information of 0 or 1 depending on whether the value is positive or negative. In the following, such binary information may be referred to as a hard determination value of LLR. Further, in the following, when LLR is positive, the hard determination value is set to 0. When LLR is negative, the hard determination value is set to 1. In addition, when LLR is 0, the hard determination value is determined according to a predetermined rule (for example, the hard determination value is set to 0).

The "hard determination value of a channel value" corresponds to information in which the channel value represented by LLR is represented by a binary value according to a positive value or a negative value as described above. Similarly, the "hard determination value of a soft-input value" corresponds toe information in which the soft-input value represented by LLR is represented by a binary value according to a positive value or a negative value as described above.

As described above, the value of the hard bit data stored in the HMEM may be updated during the decoding processing. On the other hand, the channel value is a value corresponding to the hard bit data (hard bit data before update) immediately after being set in the HMEM. For example, in a configuration in which the HMEM data is updated during the decoding processing, if hard bit data is stored in the CMEM (and not updated during the decoding processing), the code of the channel value may be obtained during the decoding processing. The code of the channel value is referred to, for example, when modifying a syndrome value, as will be described below. The code of the channel value corresponds to whether the value of the hard bit data is 0 or 1.

When an absolute value of the channel value is required, for example, two values are used depending on whether the corresponding bit is a low-reliability bit. The low-reliability bit means a bit determined to have low reliability. For example, if a bit is a low-reliability bit, $L_L$ is used, and if the bit is not a low-reliability bit, $L_H$ is used as the absolute value of the channel value. The method for determining whether or not the bit is a low-reliability bit will be described below.

In the present embodiment, the non-volatile memory 20 stores data coded into a two-dimensional error-correction code. The hard bit data stored in the read information memory 201 may be data in which a part of the data coded into a two-dimensional error-correction code is changed to another value due to an error generated on the non-volatile memory 20. The read information memory 201 outputs hard bit data to the dimension 1 syndrome value calculation unit 111 and the dimension 2 syndrome value calculation unit 121. Further, the read information memory 201 outputs read information to the dimension 1 low-reliability location information calculation unit 114 and the dimension 2 low-reliability location information calculation unit 124.

The dimension 1 syndrome value calculation unit 111 calculates a syndrome value (dimension 1 syndrome value) of a dimension 1 component code (an example of a first component code). The syndrome value is a symbol string used by the error-correction code to calculate an error position, and is obtained, for example, by multiplying a parity check matrix of the error-correction code and the hard bit data. The dimension 1 syndrome value calculation unit 111 may obtain a syndrome value by a calculation simpler than a matrix operation by utilizing the structure of the error-correction code. The dimension 1 syndrome value obtained by the dimension 1 syndrome value calculation unit 111 is output to the dimension 1 syndrome value memory 211.

The dimension 1 syndrome value memory 211 stores the dimension 1 syndrome value calculated by the dimension 1 syndrome value calculation unit 111. The dimension 1 syndrome value memory 211 outputs the dimension 1 syndrome value to the dimension 1 soft-input value calculation unit 112.

The dimension 1 low-reliability location information calculation unit 114 calculates low-reliability location information (dimension 1 low-reliability location information, an example of first low-reliability location information) of the component code of the dimension 1. The low-reliability location information is information indicating the location of one or more bits (low-reliability bits) determined to have low reliability.

The dimension 1 low-reliability location information memory 213 stores the dimension 1 low-reliability location information calculated by the dimension 1 low-reliability location information calculation unit 114. The dimension 1 low-reliability location information memory 213 outputs the dimension 1 low-reliability location information to the dimension 1 soft-input value calculation unit 112.

Figure 8:
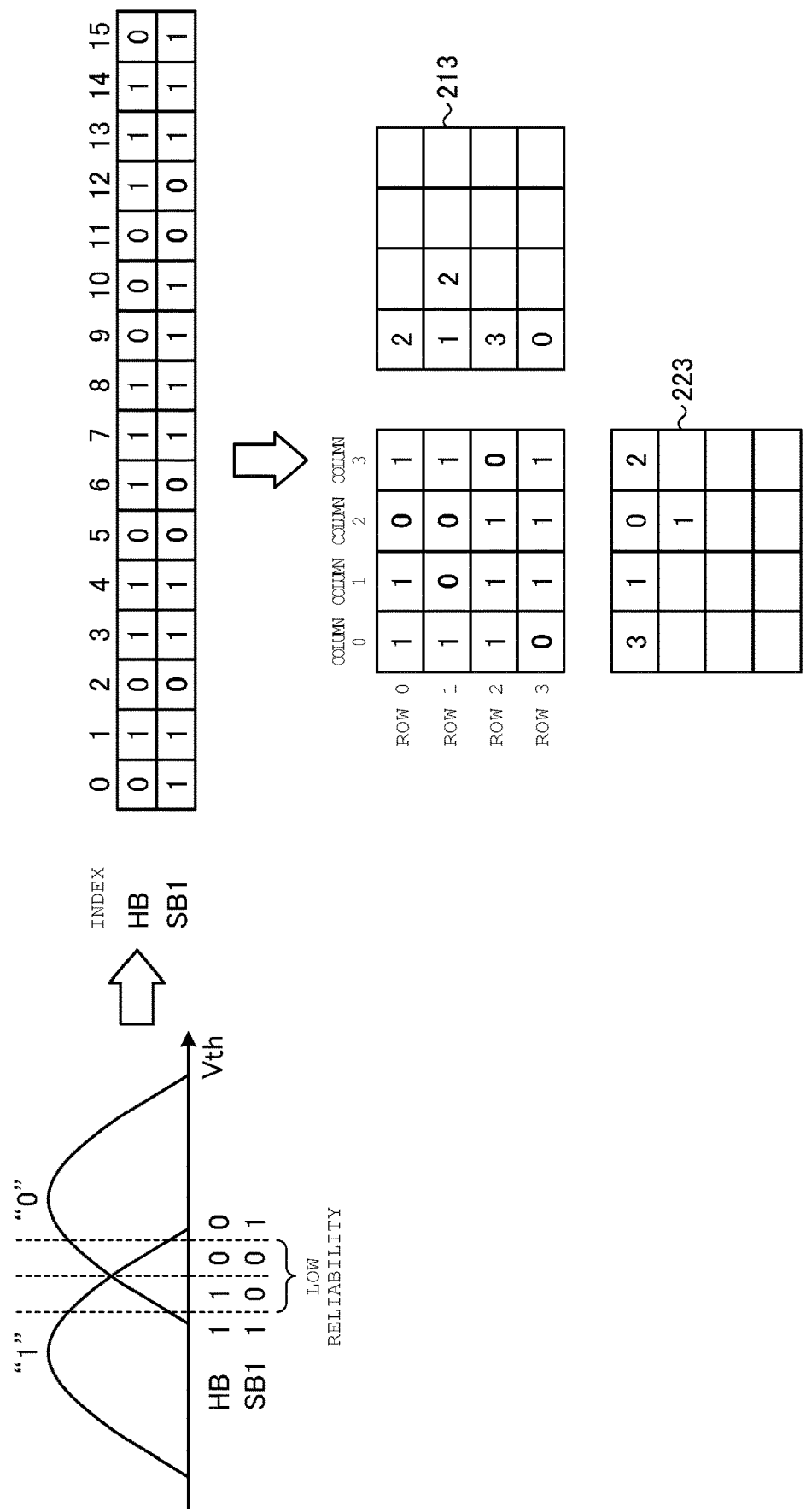
FIG. 8 is a diagram illustrating an example of calculation and storage of low-reliability location information.

FIG. 8 is a diagram illustrating an example of calculation and storage of low-reliability location information. FIG. 8 describes an example of using a 4-by-4 product code having a code length of 16. The graph on the upper left of FIG. 8 shows a relationship between a threshold voltage distribution, hard bit data (HB), and soft bit data (SB1). In the example of FIG. 8, the value "0" of SB1 corresponding to an area where a distribution corresponding to the bit "1" and a distribution corresponding to the bit "0" overlap indicates that reliability of this bit is low.

That is, the dimension 1 low-reliability location information calculation unit 114 determines that the corresponding bit is a low-reliability bit when the value of SB1 is "0", and determines that the corresponding bit is not a low-reliability bit when the value of SB1 is "1".

The table on the upper right of FIG. 8 shows an example of HB and SB1 values of each of the 16 bits. The index is information that identifies each of the 16 bits. For each index, 2-bit information of HB and SB1 is obtained.

The lower right diagram of FIG. 8 includes a diagram showing SB1 of the upper right table in the same 4-by-4 format as the product code. In the example of FIG. 8, the index value and the row correspond as follows.

Index 0 to 3: row 0
Index 4 to 7: row 1
Index 8 to 11: row 2
Index 12 to 15: row 3

The dimension 1 low-reliability location information indicates the location(s) of the low-reliability bit(s) in the dimension 1 (row direction). The dimension 1 low-reliability location information can also be interpreted as corresponding to address (address within the component code) indicating the location(s) of the low-reliability bit(s) of each component code of the dimension 1.

For example, in row 0, the bit corresponding to column 2 is a low-reliability bit (value of SB1 is 0). Therefore, the dimension 1 low-reliability location information calculation unit 114 sets the dimension 1 low-reliability location information with respect to row 0 as "2", which is an address in the component code indicating the location of column 2. Similarly, the dimension 1 low-reliability location information calculation unit 114 calculates the dimension 1 low-reliability location information for rows 1 to 3. The calculated dimension 1 low-reliability location information is stored in the dimension 1 low-reliability location information memory 213 as shown in FIG. 8.

The dimension 1 low-reliability location information calculation unit 114 reads, for example, the soft bit data (SB1) stored in the CMEM, calculates the dimension 1 low-reliability location information by using the read SB1 value, and stores the calculated dimension 1 low-reliability location information in the dimension 1 low-reliability location information memory 213. This series of operations may be referred to as initialization of the dimension 1 low-reliability location information memory 213.

In the example of FIG. 8, the dimension 1 low-reliability location information memory 213 can store the dimension 1 low-reliability location information having the same size as the code length (16). The size of the dimension 1 low-reliability location information stored in the dimension 1 low-reliability location information memory 213 is not limited thereto, and may be smaller than the code length. For example, depending on the code length, each component code may be configured to store about 10 to 40 entries of the dimension 1 low-reliability location information.

When it is necessary to determine whether or not the bit in the decoding processing is a low-reliability bit, the following two methods (A1) and (A2) may be used. In the present embodiment, the method of using the dimension 1 low-reliability location information memory 213 as in (A1) is mainly applied.

(A1) If the dimension 1 low-reliability location information memory 213 is accessed and the dimension 1 low-reliability location information (address in the component code) indicating the location of the corresponding bit exists, it is determined that the corresponding bit is a low-reliability bit. If the dimension 1 low-reliability location information does not exist, it is determined that the corresponding bit is a high-reliability bit.

(A2) If the CMEM is accessed and SB1 of the corresponding bit is 0, it is determined that the corresponding bit is a low-reliability bit. If SB1 is 1, it is determined that the corresponding bit is a high-reliability bit.

Returning to FIG. 7, the dimension 1 soft-input value calculation unit 112 calculates the dimension 1 soft-input value (an example of the first soft-input value) by using a dimension 1 syndrome value from the dimension 1 syndrome value memory 211, modification information input from the dimension 1 modification information memory 212, reliability information from the reliability information memory 231, and the dimension 1 low-reliability location information from the dimension 1 low-reliability location information memory 213. The details of the calculation method of the dimension 1 soft-input value by the dimension 1 soft-input value calculation unit 112 will be described below. The dimension 1 soft-input value calculation unit 112 outputs the dimension 1 soft-input value to the dimension 1 SISO decoding unit 113.

The dimension 1 modification information memory 212 is a memory for storing modification information (dimension 1 modification information, an example of first modification information) of the component code of the dimension 1. Similarly, the dimension 2 modification information memory 222 is a memory for storing modification information (dimension 2 modification information, an example of second modification information) of a dimension 2 component code (an example of a second component code).

The modification information includes information indicating the location (modified location) modified by the decoding processing and information indicating the difference between the values. The modified location indicates, for example, a location where the value is different between the decoded word generated through by the decoding processing and the read data (hard bit data). When the symbol is an element in a binary field, the information indicating the difference between the values may be omitted. In the case of a binary field, "values being different" is limited to "bits being inverted". In the case of a binary field, the modified location can also be interpreted as the location where the bit is corrected (corrected bit location).

In the present embodiment where the symbol is an element in a binary field, the dimension 1 modification information indicates a location where the value is different between the MAP decoded word generated through the dimension 1 decoding processing and the dimension 2 decoding processing for the dimension 1 component code and the hard bit data stored in the read information memory 201. Similarly, the dimension 2 modification information indicates a location where the value is different between the MAP decoded word generated through the dimension 1 decoding processing and the dimension 2 decoding processing for the dimension 2 component code and the hard bit data stored in the read information memory 201.

The method of setting the address (dimension 1 address) used by the dimension 1 modification information to indicate the location and the method of setting the address (dimension 2 address) used by the dimension 2 modification information to indicate the location may be different. For example, the dimension 1 address may be set so that the dimension 1 soft-input value calculation unit 112 can read the dimension 1 modification information at a higher speed. Similarly, the dimension 2 address may be set so that the dimension 2 soft-input value calculation unit 122 can read the dimension 2 modification information at a higher speed. An address in which the dimension 1 address and the dimension 2 address are shared may be used. In this case, one modification information memory in which the dimension 1 modification information memory 212 and the dimension 2 modification information memory 222 are stored may be used.

The size of the dimension 1 modification information stored in the dimension 1 modification information memory 212 may be set in any way. For example, depending on the code length, with respect to each component code, the dimension 1 modification information memory 212 may be configured to store about 10 to 40 entries of the dimension 1 modification information.

The modification information for each dimension may further include an error flag and an other-dimension error flag. The error flag is information indicating whether or not the bit corresponding to the modification information is determined to be an error in the dimension corresponding to the modification information. The other dimension error flag is information indicating whether or not the bit corresponding to the modification information is determined to be an error in a dimension other than the dimension corresponding to the modification information (the other dimension).

For example, the dimension 1 modification information may include an error flag indicating whether or not an error is determined in the dimension 1 and an other-dimension error flag indicating whether or not an error is determined in the dimension 2.

As will be described below, the dimension 1 syndrome value memory 211 may store a syndrome value modified so as to correspond to the "syndrome value calculated from the hard determination value of the soft-input value". For such a configuration, the modification information may further include an inversion flag. The inversion flag is information indicating whether or not the code of the soft-input value is inverted in the dimension corresponding to the modification information. Whether or not the code of the soft-input value is inverted may be rephrased as whether or not the code of the soft-input value is opposite to the code of the channel value.

The reliability information memory 231 is a memory for storing reliability information. The reliability information is information indicating certainty (decoding reliability) of SISO decoding of each component code. The reliability information memory 231 stores reliability information for each component code. For example, the reliability information memory 231 stores reliability information of the component code of the dimension 1 (an example of first reliability information) and reliability information of the component code of the dimension 2 (an example of second reliability information).

The reliability information is, for example, a metric calculated from a soft-input value (=probability information) and indicating whether a codeword c has a high or low probability of being the original component codeword. For example, as the reliability information in a binary code, the likelihood calculated from the soft-input value S for the codeword c may be used. The reliability information is not limited thereto, and for example, the following information may be used.

(I1) Probability value with correct codeword c
(I2) Value of a distance function between the codeword c and the soft-input value S
(I3) A value obtained by applying a logarithmic function or the like to the value shown in (I1) or (I2) above.

The dimension 1 SISO decoding unit 113 performs SISO decoding using the dimension 1 soft-input value input from the dimension 1 soft-input value calculation unit 112, and obtains modification information (corrected bit location) and reliability information of the SISO decoding. The dimension 1 SISO decoding unit 113 outputs the modification information (corrected bit location) to the dimension 1 modification information memory 212 and the dimension 2 modification information memory 222, and outputs the reliability information to the reliability information memory 231.

The dimension 1 SISO decoding unit 113 represents the modification information (corrected bit location) to be output to the dimension 1 modification information memory 212 and the dimension 2 modification information memory 222 by the addresses (dimension 1 address or dimension 2 address) used in the respective memories, and outputs the modification information to the corresponding memory.

As described above, the processing for the component code of the dimension 1 is achieved by using the dimension 1 syndrome value calculation unit 111, the dimension 1 syndrome value memory 211, the dimension 1 low-reliability location information calculation unit 114, the dimension 1 low-reliability location information memory 213, the dimension 1 soft-input value calculation unit 112, the dimension 1 SISO decoding unit 113, the dimension 1 modification information memory 212, the reliability information memory 231, and the dimension 2 modification information memory 222.

If the "dimension 1" and the "dimension 2" are interchanged, the processing for the component code of the dimension 2 is equivalent to the processing for the component code of the dimension 1, and therefore detailed description thereof will be omitted. For example, each part used in the processing for the dimension 1 component code corresponds to each part used in the processing for the dimension 2 component code as follows.

Dimension 1 syndrome value calculation unit 111: dimension 2 syndrome value calculation unit 121

Dimension 1 syndrome value memory 211: dimension 2 syndrome value memory 221

Dimension 1 low-reliability location information calculation unit 114: dimension 2 low-reliability location information calculation unit 124

Dimension 1 low-reliability location information memory 213: dimension 2 low-reliability location information memory 223

Dimension 1 soft-input value calculation unit 112: dimension 2 soft-input value calculation unit 122

Dimension 1 SISO decoding unit 113: dimension 2 SISO decoding unit 123

Dimension 1 modification information memory 212: dimension 2 modification information memory 222

The reliability information memory 231 is commonly used in the processing for the component codes of the dimension 1 and the processing for the component codes of the dimension 2.

In the following, when the dimensions are not distinguished, each memory may be expressed as follows.

Figure 9:
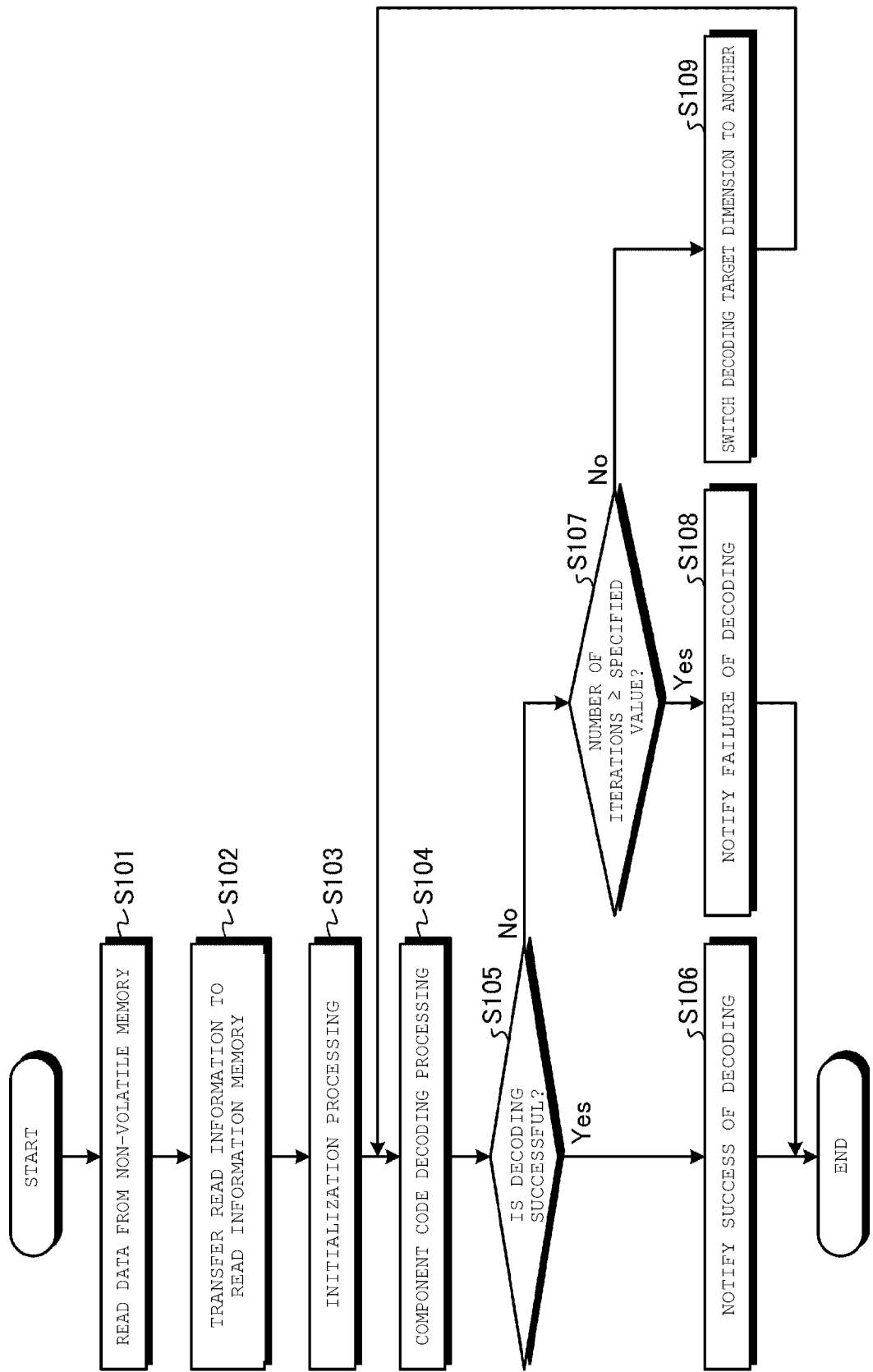
FIG. 9 is a flowchart of decoding processing by the memory system according to the embodiment.

Dimension 1 syndrome value memory 211, dimension 2 syndrome value memory 221: SMEM Dimension 1 low-reliability location information memory 213, dimension 2 low-reliability location information memory 223: LMEM Dimension 1 modification information memory 212, dimension 2 modification information memory 222: FMEM FIG. 9 is a flowchart showing an example of the decoding processing by the memory system of the present embodiment. FIG. 9 shows an example of decoding processing for a two-dimensional error-correction code.

The control unit 11 reads the error-correction code from the non-volatile memory 20 and obtains the read information (step S101). The control unit 11 transfers the read information to the read information memory 201 and stores the information (step S102).

The SISO decoding unit 182 executes initialization processing (step S103). The initialization processing includes, for example, the following processing.

Store the read information transferred from the control unit 11 in the read information memory 201 (HMEM, CMEM)

Set the dimension to be decoded (decoding target dimension: row or column)

Calculate the syndrome value of each component code from the hard bit data stored in HMEM and store the calculated value in SMEM Empty the entries of FMEM Initialize the reliability information memory 231 to 0

Initialize LMEM

As described above, the initialization processing of step S103 includes the initialization of LMEM. As in the modification example described below, the initialization of LMEM may not be included in the initialization processing of step S103.

After the initialization processing, the SISO decoding unit 182 executes component code decoding processing (component code decoding processing) of the set dimension (step S104). The details of the component code decoding processing will be described below.

The SISO decoding unit 182 determines whether or not the decoding is successful (step S105). Successful decoding may mean, for example, that decoded data that can be determined to be correct is found.

When the decoding is not successful (NO in step S105), the SISO decoding unit 182 determines whether or not the number of iterations of the present operation reaches a specified value (step S07). When the specified value is not reached (NO in step S107), the SISO decoding unit 182 switches the decoding target dimension to another dimension, increases the number of iterations by 1, returns to step S104, and executes the subsequent operations. When the specified value is reached (YES in step S107), the SISO decoding unit 182 notifies an external control unit or the like of the failure of the decoding (step S108), and ends the decoding processing. The number of iterations may be, for example, the number of times the component code decoding processing of step S104 is repeated.

When the decoding is successful (YES in step S105), the SISO decoding unit 182 notifies the external control unit or the like of the decoded data with the success of the decoding (step S106), and ends the decoding processing. The SISO decoding unit 182 modifies the hard bit data written in the read information memory 201 by using, for example, information stored in the reliability information memory 231, the dimension 1 modification information memory 212, and the dimension 2 modification information memory 222, which is obtained by the decoding processing. The SISO decoding unit 182 uses the modified hard bit data as a final output (output decoded word).

For example, the SISO decoding unit 182 calculates a logarithmic posterior probability ratio for each bit of the hard bit data in the read information memory 201 by using the above Equation (1). The SISO decoding unit 182 determines whether to modify the hard bit data corresponding to each bit stored in the read information memory 201 based on the positive/negative of the calculated logarithmic posterior probability ratio. The SISO decoding unit 182 modifies the hard bit data as determined and uses the modified data as an output decoded word.

Figure 10:
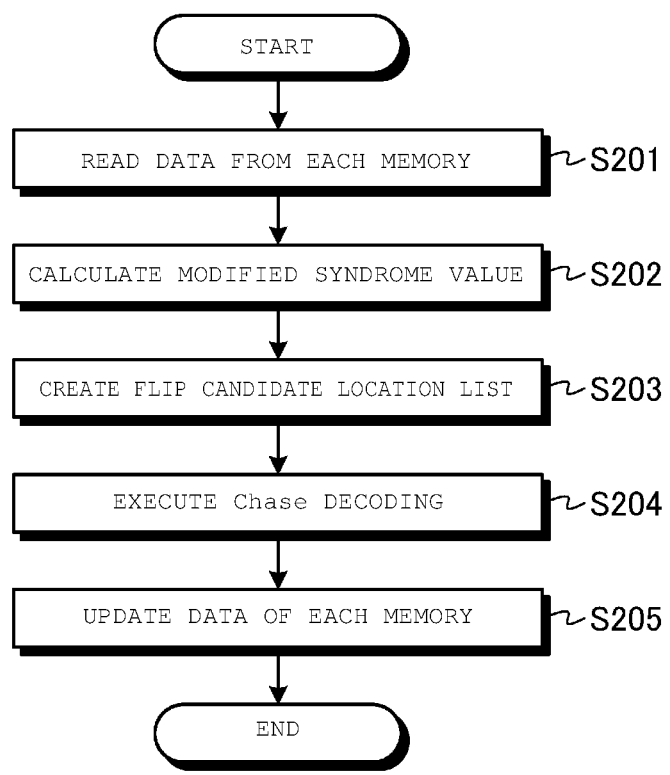
FIG. 10 is a flowchart of component code decoding processing.

Next, the details of the component code decoding processing in step S104 will be described. FIG. 10 is a flowchart showing an example of the component code decoding processing.

In FIG. 10, the case of decoding the component code of the dimension 1 (row) will be described as an example. The same procedure can be applied to another dimension (dimension 2: column). Further, in the following, an example will be described in which Chase decoding is used in which the bit having a high probability of error is flipped (inverted) and then a limit distance decoding is performed. The applicable decoding method is not limited to Chase decoding, and any applicable decoding method may be used.

The dimension 1 soft-input value calculation unit 112 of the SISO decoding unit 182 reads out data used for decoding from each memory (step S201). For example, the dimension 1 soft-input value calculation unit 112 reads a syndrome value (dimension 1 syndrome value) from SMEM, reads modification information (dimension 1 modification information) from FMEM, reads the low-reliability location information (dimension 1 low-reliability location information) from the LMEM, and reads the reliability information from the reliability information memory 231.

The dimension 1 soft-input value calculation unit 112 calculates the syndrome value (value corresponding to the syndrome value calculated from the hard determination value of the soft-input value) corresponding to the hard determination value of the soft-input value using each read information (step S202). Details of step S202 will be described below. The syndrome value corresponding to the hard determination value of the soft-input value may be referred to as a modified syndrome value below.

The dimension 1 SISO decoding unit 113 creates a flip candidate location list to be used in Chase decoding by using the dimension 1 modification information, the dimension 1 low-reliability location information, and the like (step S203). The flip candidate location list is information including candidates for a flip location (inversion location) indicating the location of the bit to be inversed. Details of the method for creating the flip candidate location list will be described below.

The dimension 1 SISO decoding unit 113 executes Chase decoding using the modified syndrome value obtained in step S202 and the flip candidate location list obtained in step S203 (step S204).

The dimension 1 SISO decoding unit 113 stores modification information indicating the corrected bit location in Chase decoding in the dimension 1 modification information memory 212 and the dimension 2 modification information memory 222, and stores the reliability information obtained as a result of Chase decoding in the reliability information memory 231 (step S205).

Next, Modification Example 1 and Modification Example 2 in which the initialization timing of the LMEM is changed will be described.

Modification Example 1

Figure 11:
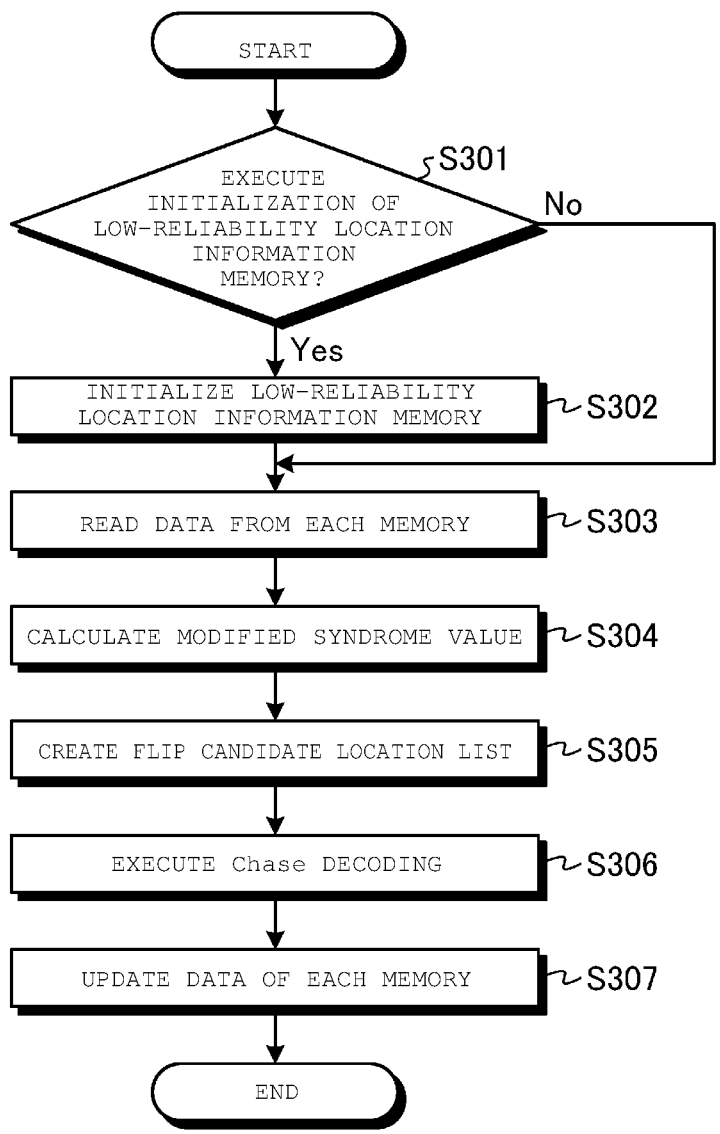
FIG. 11 is a flowchart of the component code decoding processing according to a modification example 1.

In Modification Example 1, the initialization of the LMEM is not executed in the initialization processing of step S103 in FIG. 9. Instead, the initialization of the LMEM is executed in the component code decoding processing of step S104. FIG. 11 is a flowchart of the component code decoding processing according to Modification Example 1. In the following, the case of decoding the component code of the dimension 1 (row) will be described as an example. However, the same procedure can be applied to another dimension (dimension 2, column).

The dimension 1 low-reliability location information calculation unit 114 determines whether or not to execute the initialization of the LMEM (dimension 1 low-reliability location information memory 213) (step S301). For example, when the dimension 1 low-reliability location information calculation unit 114 first executes the component code decoding processing for the component code set as a decoding target in the decoding processing started according to FIG. 9, it is determined to execute the initialization of the LMEM. In the other cases, the dimension 1 low-reliability location information calculation unit 114 determines that the LMEM initialization is not executed.

When it is determined to execute the initialization of the LMEM (YES in step S301), the dimension 1 low-reliability location information calculation unit 114 initializes the entries of the component code set as the decoding target among the entries of the LMEM. For example, when the component code decoding processing is first executed for the row 0 in FIG. 8, the dimension 1 low-reliability location information calculation unit 114 calculates the dimension 1 low-reliability location information for row 0, and stores the calculated dimension 1 low-reliability location information in the dimension 1 low-reliability location information memory 213.

In the present modification example, since only the entries required for each component code are targeted for initialization, the processing time is shortened. Further, it is possible to parallelize processing including initialization of LMEM for a certain component code and another processing for another component code. As a result, the number of processing cycles required for the entire decoding processing can be relatively reduced.

After executing the initialization of the LMEM, and when it is not determined to execute the initialization of the LMEM (NO in step S301), the dimension 1 low-reliability location information calculation unit 114 executes the subsequent steps S303 to S307. Since steps S303 to S307 are the same as steps S201 to S205 of FIG. 10, detailed description thereof will be omitted.

Modification Example 2

The above-described embodiment and Modification Example 1 are examples provided with low-reliability location information memories (dimension 1 low-reliability location information memory 213 and dimension 2 low-reliability location information memory 223) for storing low-reliability location information for each of the M component codes. For example, as shown in FIG. 8, in the case of a 4-by-4 product code (M=8), the dimension 1 low-reliability location information memory 213 stores the dimension 1 low-reliability location information for each of the four component codes in the row direction, and the dimension 2 low-reliability location information memory 223 stores the dimension 2 low-reliability location information for each of the four component codes in the column direction.

In Modification Example 2, an example in which a low-reliability location information memory includes a storage area for storing low-reliability location information on Q (Q<M) component codes smaller than M component codes will be described. The dimension 1 low-reliability location information memory 213 and the dimension 2 low-reliability location information memory 223 may be configured to store low-reliability location information of Q component codes in total, or one low-reliability location information memory that integrates the dimension 1 low-reliability location information memory 213 and the dimension 2 low-reliability location information memory 223 may be configured to store the low-reliability location information of Q component codes. In the former case, for example, the dimension 1 low-reliability location information memory 213 and the dimension 2 low-reliability location information memory 223 may store low-reliability location information of Q' (Q'<(M/2)) component codes, respectively.

In the present modification example, the LMEM is initialized every time in the component code decoding processing. For example, when the component code decoding processing is executed for a certain component code, the low-reliability location information is calculated for the component code each time, and the calculated low-reliability location information is stored in the unused storage area in the storage area of the low-reliability location information for Q pieces. When the component code decoding processing of the component code is completed, the stored low-reliability location information is deleted, that is, the corresponding region of the LMEM is cleared.

The present modification example can be interpreted as a configuration in which a storage area that can store low-reliability location information of a number (Q) of component codes smaller than the number (M) of all component codes is used.

Q can be any value as long as Q is 1 or more and less than M. For example, in the case of a configuration in which processing for a plurality of component codes is executed in parallel by pipeline processing or the like, Q may be a value corresponding to the number of stages of pipeline processing.

Figure 12:
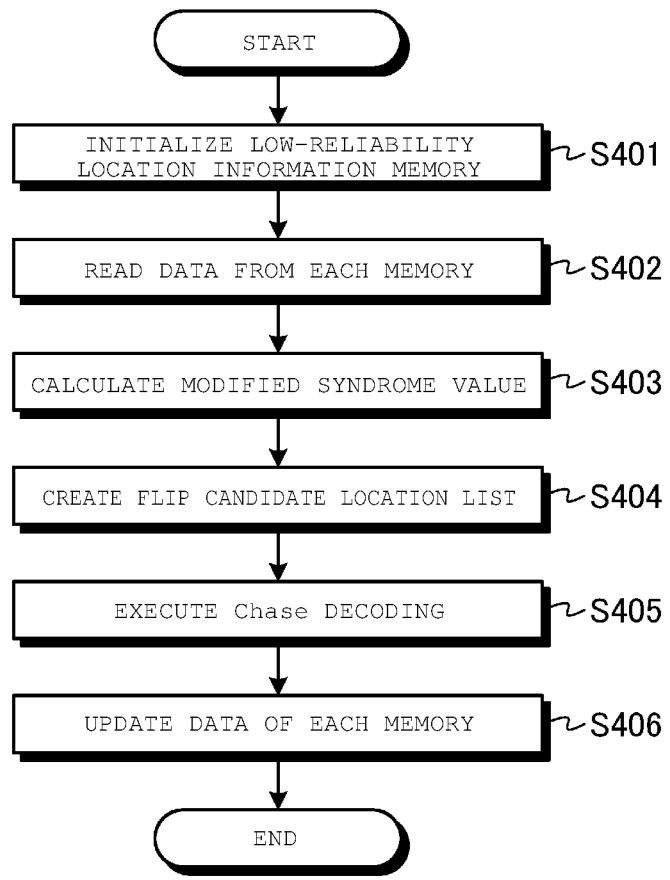
FIG. 12 is a flowchart of a component code decoding processing according to a modification example 2.

FIG. 12 is a flowchart of the component code decoding processing according to Modification Example 2. In the following, the case of decoding the component code of the dimension 1 (row) will be described as an example. However, the same procedure can be applied to another dimension (dimension 2, column).

The dimension 1 low-reliability location information calculation unit 114 initializes the dimension 1 low-reliability location information memory 213 for the component code set as a decoding target (step S401). For example, the dimension 1 low-reliability location information calculation unit 114 calculates the dimension 1 low-reliability location information for the component code, and stores the calculated dimension 1 low-reliability location information in the unused storage area of the dimension 1 low-reliability location information memory 213.

Since steps S402 to S406 are the same as steps S201 to S205 of FIG. 10, detailed description thereof will be omitted.

According to the present modification example, the size of the low-reliability location information memory can be further reduced. As a result, for example, the circuit scale of the memory system 1 can be reduced.

Next, the details of the calculation method of the modified syndrome value in step S202 will be described. In the calculation of the modified syndrome value, the calculation of the soft-input value is executed.

In the following, a case where the dimension 1 soft-input value calculation unit 112 calculates the dimension 1 soft-input value and the dimension 1 modified syndrome value during the component code decoding processing of the dimension 1 component code will be described as an example. Further, in the following, a case where the modification information includes the modification location, the error flag, and the other dimension error flag, and the soft-input value is calculated at the modified location corresponding to a certain entry (modification information) in FMEM will be described. Further, in the following, the component code in the other dimension that intersects at the modification location to be processed is referred to as "the component code of interest in the other dimension". Therefore, in this example, the other dimension is a dimension 2. The same procedure as for the dimension 1 can be applied to the dimension 2.

The dimension 1 soft-input value calculation unit 112 inputs the following input information and outputs a soft-input value $L_{in}$ as output information.

Input Information:

L (channel value): $L_L$ for low-reliability bits, $L_H$ for non-low-reliability bits ($|L_L|<|L_H|$)

$f_1$: Error flag (1 when determined to be an error, 0 otherwise)

$f_2$: The other dimension error flag (1 when determined to be an error, 0 otherwise)

$\Phi_1$: Decoding reliability of the component code of interest in the decoding target dimension (probability value of 0 or more and 1 or less)

$\Phi_2$: Decoding reliability of the component code of interest in the other dimension (probability value of 0 or more and 1 or less)

The reliability information memory 231 may store the probability value indicating the decoding reliability as is (with a certain quantization bit width), or may store the discrete value corresponding to the decoding reliability. In the latter case, the dimension 1 soft-input value calculation unit 112 may convert the discrete value stored when calculating the soft-input value (by table lookup or the like) into a probability value.

The soft-input value $L_{in}$, which is the output information, is calculated by using the following Equations (2) to (4).

$$L_{in} = L + h(L', f_2, \phi_2) \quad (2)$$

$$h(l, f, \phi) = g(l, f, \phi) - l \quad (3)$$

$$g(l, f, \phi) = (-1)^f \ln\left[\frac{\phi + \exp[(-1)^f l]}{1 - \phi}\right] \quad (4)$$

L′ of Equation (2) is calculated by any of the following Equations (5) to (7).

$$L'=L \quad (5)$$

When $\Phi_1 > \Phi_2, L' = g(L, f_1, \Phi_1),$

When $\Phi_1 \leq \Phi_2, L' = L \quad (6)$

When $\Phi_1 \geq \Phi_2, L' = g(L, f_1, \Phi_1),$

When $\Phi_1 < \Phi_2, L' = L \quad (7)$ $L_{in}$ may be calculated by a circuit that executes calculation according to each of the above equations, or may be calculated by using a table in which input information and output information are associated with each other. Further, in the subsequent processing, the absolute value of $L_{in}$ and the code of $L_{in}$ may be required. In such a case, the processing of extracting only the absolute value or the code may be performed after obtaining $L_{in}$, or a table in which the input information is associated with the absolute value of $L_{in}$ and a table in which the input information is associated with the code of $L_{in}$ may be used.

As described above, in the present embodiment, the soft-input value is calculated based on the modification information, the reliability information, the syndrome value, and the low-reliability location information. This soft-input value can be interpreted as being calculated from an approximately obtained external value. That is, unlike the turbo decoder of FIG. 3 that uses Max-log-MAP decoding or the like as shown in FIG. 3, in the present embodiment, it is not necessary to store the external value in the external value memory. Therefore, it is possible to avoid an increase in the amount of memory required for decoding. In addition, since the channel value can be used properly for the location with low reliability and the locations other than the location with low reliability by using the low-reliability location information, it is possible to calculate a more accurate soft-input value and improve the correction ability.

The modified syndrome value is calculated by the following procedure.

(B1) The code (positive or negative) of the soft-input value is obtained for each of the "bits stored in FMEM and determined to be an error in the other dimension".

(B2) For each bit location where the code of the soft-input value is opposite to the code of the channel value, the "flip" of the bit at the corresponding location is reflected in the syndrome value read from SMEM and output as a modified syndrome value.

When the modification information includes the above-mentioned inversion flag, whether the code of the soft-input value is opposite to the code of the channel value can be determined by using this inversion flag.

Figure 13:
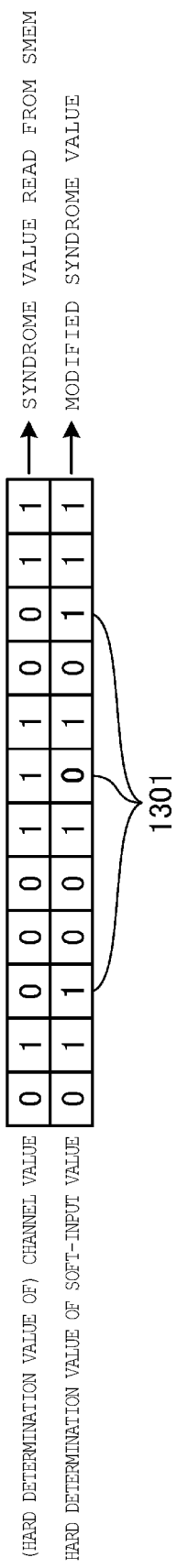
FIG. 13 is a diagram showing a calculation example of a modified syndrome value.

FIG. 13 is a diagram showing a calculation example of the modified syndrome value. As shown in FIG. 13, the syndrome value read from SMEM corresponds to the "syndrome value calculated from the hard determination value of the channel value". Modification of this syndrome value so that it becomes the "syndrome value calculated from the hard determination value of the soft-input value" corresponds to the calculation of the modified syndrome value.

There is a possibility that the code is inverted between the channel value and the soft-input value only for "bits stored in FMEM and determined to be an error in the other dimension". Therefore, the soft-input value need only be calculated at the corresponding location. In FIG. 13, the location 1301 corresponds to the location where the soft-input value is calculated.

Next, details of the method for creating the flip candidate location list in step S203 will be described. In Chase decoding, the limit distance decoding is executed after inversing the bit with a high probability of error. Therefore, for the preparation, a flip candidate location list that defines candidates for the location of the bit to be inversed is created.

Hereinafter, three examples (M1), (M2), and (M3) of the method for creating a flip candidate location list will be described.

(M1) Creation Method 1

According to the following priority order, a maximum of Y addresses in the component code of the bit to be inversed (Y is a predetermined maximum value) are acquired, and a flip candidate location list indicating the acquired addresses is created.

Priority 1: bits stored in LMEM

Priority 2: bits stored in FMEM and determined to be an error in the other dimension Priority 3: intersection bit with component code in the other dimension with decoding reliability=0

Priority 4: parity bit (M2) Creation Method 2

Replace priority 1 of creation method 1 with the following (priorities 2 to 4 are the same as creation method 1).

Priority 1: bits stored in LMEM and whose absolute value of the soft-input value is equal to or less than a threshold value Th (M3) Creation Method 3

(M3-1) For each of the "bits stored in FMEM and determined to be an error in the other dimension", the absolute value of the soft-input value is obtained.

(M3-2) For each of the bits to be processed in (M3-1), the absolute value of the soft-input value is compared with threshold values $Th_L$ and $Th_H$ ($Th_L<Th_H$). If the absolute value is $Th_L$ or less, the corresponding bit is classified into a set SL, and if the absolute value is greater than $Th_L$ and less than or equal to $Th_H$, the corresponding bit is classified as a set SH. When the absolute value is larger than $Th_H$, the corresponding bit is not classified into any set and is discarded. $Th_L$ and $Th_H$ are defined as, for example, values corresponding to the LLR absolute values of the low-reliability bit and the high-reliability bit, respectively.

(M3-3) According to the following priority order, a maximum of Y addresses in the component code of the bit to be inversed (Y is a predetermined maximum value) are acquired, and a flip candidate location list indicating the acquired addresses is created.

Priority 1: bits classified into the set SL

Priority 2: bits stored in LMEM

Priority 3: bits classified into the set SH

Priority 4: intersection bit with component code in the other dimension with decoding reliability=0

Priority 5: parity bit

As a method of determining the flip location, for example, a method of calculating the soft-input value, sorting the soft-input value by the absolute value, and determining the location of a certain number of bits in ascending order of the absolute value of the soft-input value as the flip location can be considered. On the other hand, in the present embodiment, the flip location is determined by using the modification information and the low-reliability location information stored for each component code. As a result, the processing time can be shortened.

The creation method 2 is different from the creation method 1 in the method of determining the bit of priority 1. That is, not only is it determined whether the bit is stored in LMEM, but it is also determined whether the absolute value of the soft-input value is a bit equal to or less than the threshold value Th. This makes it possible to eliminate bits that no longer have low-reliability during decoding. As a result, it is possible to increase the probability of finding the correct decoded word in Chase decoding, and to reduce the size of the flip candidate location list to shorten the processing time. Further, since the calculation target of the absolute value of the soft-input value is only the bits stored in the LMEM, an increase in the processing time can be reduced.

The present embodiment utilizes the fact that the bit location where the absolute value of the soft-input value may be relatively small is one of the following, and the number thereof is smaller than the component code length.

The location of the bit determined to have low reliability in the read information.

The location of the bit whose external value has the opposite code to the channel value (which is determined to be an error in the other dimension).

Next, an example of the procedure of Chase decoding will be described. An example will be described in which the dimension 1 SISO decoding unit 113 executes Chase decoding as dimension 1 SISO decoding.

The dimension 1 SISO decoding unit 113 obtains the corrected bit location and the reliability information by decoding in the following procedure using a modified syndrome value s' and the flip candidate location list.

(E2-1) With t, f (t≤m and f≤t, m is the size of the flip candidate location list) as any constants, f candidates are selected from the flip location candidates stored in the flip candidate location list. The following processing (E2-1-1) is performed for each combination of $_tC_f$ selections.

(E2-1-1) A syndrome value s" obtained by flipping the bit at the selected location is calculated from s'. Then, syndrome decoding is performed by using s" to obtain a corrected bit location e. Further, reliability information pr of the dimension 1 component code is obtained from corrected bit locations e and f flip locations, the reliability information stored in the reliability information memory 231, and the low-reliability location information.

(E2-2) It is assumed that (eˆ, prˆ) is the set with the maximum reliability information among the sets of corrected bit locations and reliability information obtained for each combination of selections in $_tC_f$.

(E2-3) The correction bit location eˆ and the reliability information prˆ are output.

Modification Example 3

Figure 14:
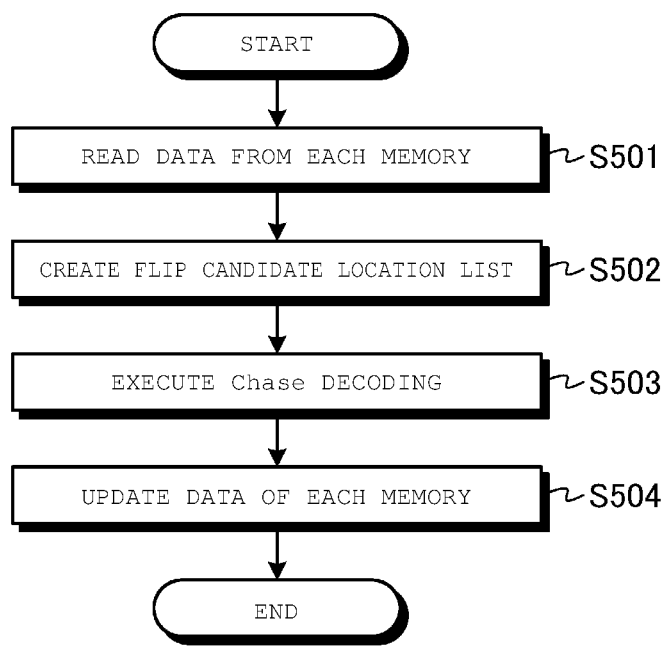
FIG. 14 is a flowchart of component code decoding processing according to a modification example 3.

In Modification Example 3, an example of updating SMEM using the calculated modified syndrome value will be described. FIG. 14 is a flowchart showing an example of the component code decoding processing according to Modification Example 3. FIG. 14 shows a modification example of the above-described embodiment (FIGS. 9 and 10, and the like) in which the initialization of LMEM is executed in the decoding processing, but the same procedure may be applied to the above-mentioned Modification Example 1 and Modification Example 2.

In the present modification example, for example, the calculation processing of the modified syndrome value corresponding to step S202 in FIG. 10 is not executed. Instead, in the data update processing (step S504) of each memory corresponding to step S205 in FIG. 10, the modified syndrome value calculation processing and the SMEM update processing based on the calculated modified syndrome value are executed.

Step S501, step S502, and step S503 of FIG. 14 are the same as steps S201, S203, and S204 of FIG. 10.

In the Chase decoding in step 503, the syndrome value stored in SMEM is used as the modified syndrome value. For example, in first component code decoding processing when the component code decoding processing (step S104) is executed a plurality of times in FIG. 9, SMEM is not updated with the modified syndrome value, but the syndrome value read from SMEM may be used as is.

In step S504, in addition to the same processing as in step S205, the following SMEM update processing is executed.

(U1) Update of SMEM corresponding to the decoding target dimension: read the syndrome value from SMEM of the decoding target dimension, execute the following processing for each modification location, and write the updated syndrome value back to SMEM of the decoding target dimension.

(U1-1) Obtain the code of the soft-input value at the start of the decoding processing at the corresponding location and the code of the soft-input value after Chase decoding with the corresponding component code.

(U1-2) Compare the two codes obtained in (U1-1), and if the codes are different, reflect the "flip" of the bit at the corresponding location in the syndrome value. If the codes are the same, do nothing.

(U2) Execute the update of SMEM corresponding to the other dimension: the following processing for each modification location.

(U2-1) In the other dimension, obtain the code of the soft-input value at the start of the decoding processing at the corresponding location and the code of the soft-input value after Chase decoding with the corresponding component code.

(U2-2) Compare the two codes obtained in (U2-1), and if the codes are different, read the syndrome value from the SMEM of the component code in the other dimension of the corresponding location, reflect the "flip" of the bit at the corresponding location in the syndrome value, and write back to the SMEM. If the codes are the same, do nothing.

The soft-input value at the start of the decoding processing is calculated by, for example, the above Equations (2) to (4), using the modification information at the start of decoding processing with the corresponding component code, the decoding reliability, and the low-reliability location information.

The soft-input value after Chase decoding with the corresponding component code is calculated by, for example, the above Equations (2) to (4), using the modification information after Chase decoding with the corresponding component code (step S503), the decoding reliability, and the low-reliability location information.

The update of SMEM of the decoding target dimension and the other dimension may be executed in parallel for each modification location. In order to simplify the processing, the code of the soft-input value at the start of the decoding processing may be stored, and the stored code may be used in the above processing ((U1-1) and (U2-1)).

By updating the SMEM of the component code in the decoding target dimension and the other dimension in this way, the "syndrome value calculated from the hard determination value of the soft-input value" is stored in the SMEM.

Modification Example 4

In the above-described embodiment and modification examples, one low-reliability location information memory (dimension 1 low-reliability location information memory 213 and dimension 2 low-reliability location information memory 223) is used for each dimension. In Modification Example 4, an example in which the degree of low reliability (low-reliability level) is represented by u (u is an integer of 2 or more), and u low-reliability location information memories corresponding to each low-reliability level are used for each dimension will be described.

For example, when a plurality of soft bit data SB1 to SBX (X≥2) are used, u low-reliability levels may be determined according to the combination of soft bit data. As described above, since the LLR value is determined based on the LLR table in which the set of hard bit data and soft bit data, and the channel value are associated with each other, u low-reliability levels may be determined according to the absolute value of LLR.

The u low-reliability location information memories are referred to when creating a flip candidate location list as follows. The u low-reliability location information memories are expressed as $LMEM_1$, $LMEM_2$, . . . , $LMEM_u$ in order from the lowest low-reliability level. Hereinafter, three examples (M4), (M5), and (M6) of a method for creating a flip candidate location list using the u low-reliability location information memories will be described.

(M4) Creation Method 4

According to the following priority order, a maximum of Y addresses in the component code of the bit to be flipped (Y is a predetermined maximum value) are acquired, and a flip candidate location list indicating the acquired addresses is created.

Priority 1: bits stored in $LMEM_1$
Priority 2: bits stored in $LMEM_2$
(Omitted)
Priority u: bits stored in $LMEM_u$
Priority u+1: bits stored in FMEM and determined to be an error in the other dimension
Priority u+2: intersection bit with component code in the other dimension with decoding reliability=0
Priority u+3: parity bit (M5) Creation Method 5

According to the following priority order, a maximum of Y addresses in the component code of the bit to be flipped (Y is a predetermined maximum value) are acquired, and a flip candidate location list indicating the acquired addresses is created. The LLR absolute values corresponding to u low-reliability levels are $Th_1$, $Th_2$, . . . , $Th_u$.

Priority 1: bits stored in $LMEM_1$ and whose absolute value of the soft-input value is $Th_1$ or less
Priority 2: bits stored in $LMEM_2$ and whose absolute value of the soft-input value is $Th_2$ or less
(Omitted)
Priority u: bits stored in $LMEM_u$ and whose absolute value of the soft-input value is $Th_u$ or less
Priority u+1: bits stored in FMEM and determined to be an error in the other dimension
Priority u+2: intersection bit with component code in the other dimension with decoding reliability=0
Priority u+3: parity bit (M6) Creation Method 6

(M6-1) It is assumed that the LLR absolute values corresponding to u low-reliability levels are $Th_1$, $Th_2$, . . . , $Th_u$. Further, the high-reliability LLR absolute value (minimum value when there are a plurality of values) is set to $Th_{u+1}$.

(M6-2) For each of the "bits stored in FMEM and determined to be an error in the other dimension", the absolute value of the soft-input value is obtained.

(M6-3) For each of the bits processed in (M6-2), the absolute value of the soft-input value is compared with (u+1) threshold values $Th_1$, . . . , $Th_{u+1}$, respectively. The target bits are classified into a set $S_k$ (k=1, . . . , u+1) or discarded according to the comparison result. For example, if the absolute value of the soft-input value is expressed as $|L_{in}|$, when $|L_{in}|<Th_1$, the target bits are classified into a set $S_1$, and when $Th_k \leq |L_{in}| < Th_{k+1}$, the target bits are classified into a set $S_{k+1}$, and at other times, the target bits are discarded.

(M6-4) According to the following priority order, a maximum of Y addresses in the component code of the bit to be flipped (Y is a predetermined maximum value) are acquired, and a flip candidate location list indicating the acquired addresses is created.

Priority 1: bits classified into set $S_1$
Priority 2: bits stored in $LMEM_1$
Priority 3: bits classified into set $S_2$
Priority 4: bits stored in $LMEM_2$
(Omitted)
Priority 2u−1: bits classified into set $S_u$
Priority 2u: bits stored in $LMEM_u$
Priority 2u+1: bits classified into set $S_{u+1}$
Priority 2u+2: intersection bit with component code in the other dimension with decoding reliability=0
Priority 2u+3: parity bit When calculating the soft-input value, for example, the low-reliability location information stored in predetermined low-reliability location information memory is used among the u low-reliability location information memories.

Modification Example 5

Modification Example 5 is provided with a function of reducing the amount of information stored in the modification information memory in order to avoid a situation in which "the amount of modification information data exceeds the amount of data that can be stored in the modification information memory". For example, when the reliability information is sufficiently high, the decoder 18 modifies the hard bit data stored in HMEM of the read information memory 201 according to the modification information, instead of storing the modification information in the modification information memory. The reliability information is sufficiently high, for example, when the amount of the reliability information is larger than a threshold value. Further, the decoder 18 also modifies each syndrome value stored in the syndrome value memory (dimension 1 syndrome value memory 211 and dimension 2 syndrome value memory 221) so as to be consistent with the modified hard bit data. In this way, the detected error information can be reflected in the hard bit data without storing the modification information in the modification information memory.

As a method of reducing the amount of memory required for decoding, there is, for example, a method of storing intermediate information (for example, MAP decoded word and reliability information indicating correctness of the decoded word) necessary for calculating an external value instead of storing the external value itself in the external value memory and generating the external value using the intermediate information when the external value is needed. However, in such a method, since the amount of data of the MAP decoded word depends on the code length, the effect of reducing the amount of memory is reduced when the code length is long.

In contrast, according to the present embodiment, the decoding processing including the calculation of the external value is executed by using the syndrome value, the modification information, and the low-reliability location information that do not depend on the code length. This makes it possible to reduce the amount of memory required for decoding. Further, since the reading/writing time of the information used for the decoding processing is shortened, the processing time of the decoding processing can be shortened.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a non-volatile memory; and
a memory controller configured to write data into and read data from the non-volatile memory, the memory controller including:
an encoder configured to generate multi-dimensionally-coded data containing write data bits and parity bits, to be written into the non-volatile memory, data bits of the multi-dimensionally-coded data being grouped into a plurality of first dimensional codes with respect to a first dimension and a plurality of second dimensional codes with respect to a second dimension; and
a decoder configured to:
receive the multi-dimensionally-coded data read from the non-volatile memory; and
with respect to each of the first and second dimensional codes included in the read multi-dimensionally-coded data,
generate a syndrome value of the dimensional code;
generate low-reliability location information indicating one or more low reliable bits in the dimensional code;
generate a soft-input value based on the syndrome value and the low-reliability location information;
decode the dimensional code through correction of the dimensional code using the soft-input value; and
store, in memory, modification information indicating one or more bits of the dimensional code corrected through the correction and reliability information indicating reliability of the correction,
wherein the decoder generates the soft-input value also based on the modification information and the reliability information stored in the memory.

2. The memory system according to claim 1, wherein the memory controller further includes a first memory and a second memory, and
the decoder stores, in the first memory, the low-reliability location information with respect to each of the first dimensional codes included in the read multi-dimensionally-coded data and stores, in the second memory, the low-reliability location information with respect to each of the second dimensional codes included in the read multi-dimensionally-coded data.

3. The memory system according to claim 2, wherein the decoder is further configured to initialize the first memory and the second memory before generating the syndrome value of any of the first and second dimensional codes included in the read multi-dimensionally-coded data.

4. The memory system according to claim 2, wherein the decoder is further configured to initialize the first memory before generating the syndrome value of any of the first dimensional codes included in the read multi-dimensionallycoded data and initialize the second memory before generating the syndrome value of any of the second dimensional codes included in the read multi-dimensionally-coded data.

5. The memory system according to claim 2, wherein the decoder is further configured to clear a region of the first memory that stores the low-reliability location information with respect to one of the first dimensional codes included in the read multi-dimensionally-coded data upon the one of the first dimensional codes being decoded.

6. The memory system according to claim 1, wherein the memory includes a third memory and a fourth memory, and
the decoder stores, in the third memory, the modification information with respect to each of the first dimensional codes included in the read multi-dimensionally-coded data and stores, in the fourth memory, the modification information with respect to each of the second dimensional codes included in the read multi-dimensionally-coded data.

7. The memory system according to claim 6, wherein the memory further includes a fifth memory, and
the decoder stores, in the fifth memory, the reliability information with respect to each of the first and second dimensional codes included in the read multi-dimensionally-coded data.

8. The memory system according to claim 1, wherein the memory controller further includes a sixth memory and a seventh memory, and
the decoder stores, in the sixth memory, the syndrome value with respect to each of the first dimensional codes included in the read multi-dimensionally-coded data and stores, in the seventh memory, the syndrome value with respect to each of the second dimensional codes included in the read multi-dimensionally-coded data.

9. The memory system according to claim 1, wherein with respect to each of the first and second dimensional codes included in the read multi-dimensionally-coded data, the decoder is further configured to generate a modified syndrome value, which is a syndrome value of a hard-bit value of the soft-input value, and decode the dimensional code through correction of the dimensional code using the modified syndrome value.

10. The memory system according to claim 1, wherein with respect to each of the first and second dimensional codes included in the read multi-dimensionally-coded data, the decoder is configured to decode the dimensional code by performing inversion of one or more bits of the syndrome value thereof using the modification information thereof and the low-reliability location information thereof and limit distance decoding using the inverted syndrome value.

11. The memory system according to claim 10, wherein with respect to each of the first and second dimensional codes included in the read multi-dimensionally-coded data, the decoder is configured to perform the inversion of up to a predetermined number of bits of the syndrome value, prioritizing one or more bits of the syndrome value indicated by the low-reliability location information over one or more bits indicated by the modification information.

12. The memory system according to claim 10, wherein with respect to each of the first and second dimensional codes included in the read multi-dimensionally-coded data, the decoder is configured to determine an absolute value of each bit of the soft-input value, and perform the inversion of up to a predetermined number of bits of the syndrome value, with priority given to one or more bits of the syndrome value corresponding to one or more bits of the soft-input value of which absolute value is less than a threshold value over one or more bits of the syndrome value corresponding to one or more bits of the soft-input value of which absolute value is greater than the threshold value.

13. An encoding and decoding method in a memory system, the method comprising:
generating multi-dimensionally-coded data containing write data bits and parity bits, to be written into a non-volatile memory, data bits of the multi-dimensionally-coded data being grouped into a plurality of first dimensional codes with respect to a first dimension and a plurality of second dimensional codes with respect to a second dimension;
receiving the multi-dimensionally-coded data read from the non-volatile memory; and
with respect to each of the first and second dimensional codes included in the read multi-dimensionally-coded data,
generating a syndrome value of the dimensional code;
generating low-reliability location information indicating one or more low reliable bits in the dimensional code;
generating a soft-input value based on the syndrome value and the low-reliability location information;
decoding the dimensional code through correction of the dimensional code using the soft-input value; and
storing, in memory, modification information indicating one or more bits of the dimensional code corrected through the correction and reliability information indicating reliability of the correction,
wherein the soft-input value is generated also based on the modification information and the reliability information stored in the memory.

14. The encoding and decoding method according to claim 13, wherein
the memory system further includes a first memory and a second memory, and
the method further comprising storing comprises storing, in the first memory, the low-reliability location information with respect to each of the first dimensional codes included in the read multi-dimensionally-coded data, and storing, in the second memory, the low-reliability location information with respect to each of the second dimensional codes included in the read multi-dimensionally-coded data.

15. The encoding and decoding method according to claim 14, further comprising:
initializing the first memory and the second memory before generating the syndrome value of any of the first and second dimensional codes included in the read multi-dimensionally-coded data.

16. The encoding and decoding method according to claim 14, further comprising:
initializing the first memory before generating the syndrome value of any of the first dimensional codes included in the read multi-dimensionally-coded data; and
initializing the second memory before generating the syndrome value of any of the second dimensional codes included in the read multi-dimensionally-coded data.

17. The encoding and decoding method according to claim 14, further comprising:
clearing a region of the first memory that stores the low-reliability location information with respect to one of the first dimensional codes included in the read multi-dimensionally-coded data upon the one of the first dimensional codes being decoded.

18. The encoding and decoding method according to claim 13, wherein the memory includes a third memory and a fourth memory, and said storing comprises storing, in the third memory, the modification information with respect to each of the first dimensional codes included in the read multi-dimensionally-coded data, and storing, in the fourth memory, the modification information with respect to each of the second dimensional codes included in the read multi-dimensionally-coded data.

19. The encoding and decoding method according to claim 18, wherein the memory further includes a fifth memory, and said storing comprises storing, in the fifth memory, the reliability information with respect to each of the first and second dimensional codes included in the read multi-dimensionally-coded data.

20. The encoding and decoding method according to claim 13, wherein the memory system further includes a sixth memory and a seventh memory, and the method further comprises storing, in the sixth memory, the syndrome value with respect to each of the first dimensional codes included in the read multi-dimensionally-coded data, and storing, in the seventh memory, the syndrome value with respect to each of the second dimensional codes included in the read multi-dimensionally-coded data.

\* \* \* \* \*

UNITED STATES PATENT AND TRADEMARK OFFICE
CERTIFICATE OF CORRECTION

PATENT NO. : 11,664,822 B2
APPLICATION NO. : 17/680164
DATED : May 30, 2023
INVENTOR(S) : Yuta Kumano et al.

Page 1 of 1

It is certified that error appears in the above-identified patent and that said Letters Patent is hereby corrected as shown below:

In the Claims

Column 28, Line 40, delete "comprising storing".

Signed and Sealed this
Second Day of January, 2024

Katherine Kelly Vidal
*Director of the United States Patent and Trademark Office*